United States Patent
Murata

(10) Patent No.: US 7,511,692 B2
(45) Date of Patent: Mar. 31, 2009

(54) GRADATION VOLTAGE SELECTING CIRCUIT, DRIVER CIRCUIT, LIQUID CRYSTAL DRIVE CIRCUIT, AND LIQUID CRYSTAL DISPLAY DEVICE

(75) Inventor: Toshikazu Murata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 680 days.

(21) Appl. No.: 11/172,806

(22) Filed: Jul. 5, 2005

(65) Prior Publication Data
US 2006/0001627 A1    Jan. 5, 2006

(30) Foreign Application Priority Data

Jul. 2, 2004   (JP)   ............................. 2004-196565
Sep. 28, 2004  (JP)   ............................. 2004-281641

(51) Int. Cl.
*G09G 3/36* (2006.01)
(52) U.S. Cl. ........................................ 345/89; 345/690
(58) Field of Classification Search ............ 345/87–89, 345/204, 690–691
See application file for complete search history.

(56) References Cited

U.S. PATENT DOCUMENTS 4,782,340 A * 11/1988 Czubatyj et al. ............... 345/92
6,232,941 B1 * 5/2001 Ode et al. ...................... 345/95

FOREIGN PATENT DOCUMENTS

JP          H09-198912 A      7/1997

* cited by examiner

*Primary Examiner*—Amr Awad
*Assistant Examiner*—Stephen G Sherman
(74) *Attorney, Agent, or Firm*—Sughrue Mion, PLLC

(57) ABSTRACT

A gradation voltage selecting circuit includes a plurality of gradation selecting MOS Tr groups, M-pieces half gradation voltage MOS Tr groups, a switching portion and a control portion. Each of the plurality of gradation selecting MOS Tr groups corresponds to one gradation voltage. The M-pieces half gradation voltage MOS Tr groups are connected to each other in series. The control portion supplies a second signal in response to a second display data. The first gradation selecting MOS Tr group selects a first gradation voltage in response to the second signals. The second gradation selecting MOS Tr group selects a second gradation voltage in response to the second signals. The first and second gradation selecting MOS Tr groups and the M-pieces half gradation voltage MOS Tr groups voltage-divide a gradation voltage between the first gradation voltage and the second gradation voltage into (M+2) equal parts in response to the second signal, and generate (M+1)-pieces half gradation voltages. The switching portion selects and outputs one of the (M+1)-pieces half gradation voltages into the display portion in response to the second signal. The (M+1)-pieces half gradation voltages are determined by ON resistance of the first and second gradation selecting MOS Tr groups and the half gradation voltage MOS Tr group.

20 Claims, 14 Drawing Sheets

Fig. 4 PRIOR ART

| OUTPUT GRADATION VOLTAGE | FIRST SWITCHING PORTION TO BE TURNED ON | SECOND SWITCHING PORTION TO BE TURNED ON | OUTPUT GRADATION VOLTAGE | FIRST SWITCHING PORTION TO BE TURNED ON | SECOND SWITCHING PORTION TO BE TURNED ON |
|---|---|---|---|---|---|
| V00' | S00, S01 | Sa | V32' | S07, S08 | Sa |
| V01' | S00, S01 | Sb | V33' | S08, S09 | Sb |
| V02' | S00, S01 | Sc | V34' | S08, S09 | Sc |
| V03' | S00, S01 | Sd | V35' | S08, S09 | Sd |
| V04' | S00, S01 | Se | V36' | S08, S09 | Se |
| V05' | S01, S02 | Sd | V37' | S09, S10 | Sd |
| V06' | S01, S02 | Sc | V38' | S09, S10 | Sc |
| V07' | S01, S02 | Sb | V39' | S09, S10 | Sb |
| V08' | S01, S02 | Sa | V40' | S09, S10 | Sa |
| V09' | S02, S03 | Sb | V41' | S10, S11 | Sb |
| V10' | S02, S03 | Sc | V42' | S10, S11 | Sc |
| V11' | S02, S03 | Sd | V43' | S10, S11 | Sd |
| V12' | S02, S03 | Se | V44' | S10, S11 | Se |
| V13' | S03, S04 | Sd | V45' | S11, S12 | Sd |
| V14' | S03, S04 | Sc | V46' | S11, S12 | Sc |
| V15' | S03, S04 | Sb | V47' | S11, S12 | Sb |
| V16' | S03, S04 | Sa | V48' | S11, S12 | Sa |
| V17' | S04, S05 | Sb | V49' | S12, S13 | Sb |
| V18' | S04, S05 | Sc | V50' | S12, S13 | Sc |
| V19' | S04, S05 | Sd | V51' | S12, S13 | Sd |
| V20' | S04, S05 | Se | V52' | S12, S13 | Se |
| V21' | S05, S06 | Sd | V53' | S13, S14 | Sd |
| V22' | S05, S06 | Sc | V54' | S13, S14 | Sc |
| V23' | S05, S06 | Sb | V55' | S13, S14 | Sb |
| V24' | S05, S06 | Sa | V56' | S13, S14 | Sa |
| V25' | S06, S07 | Sb | V57' | S14, S15 | Sb |
| V26' | S06, S07 | Sc | V58' | S14, S15 | Sc |
| V27' | S06, S07 | Sd | V59' | S14, S15 | Sd |
| V28' | S06, S07 | Se | V60' | S14, S15 | Se |
| V29' | S07, S08 | Sd | V61' | S15, S16 | Sd |
| V30' | S07, S08 | Sc | V62' | S15, S16 | Sc |
| V31' | S07, S08 | Sb | V63' | S15, S16 | Sb |

Fig. 8

| OUTPUT GRADATION VOLTAGE | GRADATION SELECTING MOS TRANSISTOR GROUP TO BE TURNED ON | SWITCH TO BE TURNED ON | OUTPUT GRADATION VOLTAGE | GRADATION SELECTING MOS TRANSISTOR GROUP TO BE TURNED ON | SWITCH TO BE TURNED ON |
|---|---|---|---|---|---|
| V0' | SS0, SS1 | S2 | V32' | SS8, SS9 | S2 |
| V1' | SS0, SS1 | S1, S2 | V33' | SS8, SS9 | S1, S2 |
| V2' | SS0, SS1 | S1, S3 | V34' | SS8, SS9 | S1, S3 |
| V3' | SS0, SS1 | S1, S4 | V35' | SS8, SS9 | S1, S4 |
| V4' | SS1, SS2 | S4 | V36' | SS9, SS10 | S4 |
| V5' | SS1, SS2 | S1, S4 | V37' | SS9, SS10 | S1, S4 |
| V6' | SS1, SS2 | S1, S3 | V38' | SS9, SS10 | S1, S3 |
| V7' | SS1, SS2 | S1, S2 | V39' | SS9, SS10 | S1, S2 |
| V8' | SS2, SS3 | S2 | V40' | SS10, SS11 | S2 |
| V9' | SS2, SS3 | S1, S2 | V41' | SS10, SS11 | S1, S2 |
| V10' | SS2, SS3 | S1, S3 | V42' | SS10, SS11 | S1, S3 |
| V11' | SS2, SS3 | S1, S4 | V43' | SS10, SS11 | S1, S4 |
| V12' | SS3, SS4 | S4 | V44' | SS11, SS12 | S4 |
| V13' | SS3, SS4 | S1, S4 | V45' | SS11, SS12 | S1, S4 |
| V14' | SS3, SS4 | S1, S3 | V46' | SS11, SS12 | S1, S3 |
| V15' | SS3, SS4 | S1, S2 | V47' | SS11, SS12 | S1, S2 |
| V16' | SS4, SS5 | S2 | V48' | SS12, SS13 | S2 |
| V17' | SS4, SS5 | S1, S2 | V49' | SS12, SS13 | S1, S2 |
| V18' | SS4, SS5 | S1, S3 | V50' | SS12, SS13 | S1, S3 |
| V19' | SS4, SS5 | S1, S4 | V51' | SS12, SS13 | S1, S4 |
| V20' | SS5, SS6 | S4 | V52' | SS13, SS14 | S4 |
| V21' | SS5, SS6 | S1, S4 | V53' | SS13, SS14 | S1, S4 |
| V22' | SS5, SS6 | S1, S3 | V54' | SS13, SS14 | S1, S3 |
| V23' | SS5, SS6 | S1, S2 | V55' | SS13, SS14 | S1, S2 |
| V24' | SS6, SS7 | S2 | V56' | SS14, SS15 | S2 |
| V25' | SS6, SS7 | S1, S2 | V57' | SS14, SS15 | S1, S2 |
| V26' | SS6, SS7 | S1, S3 | V58' | SS14, SS15 | S1, S3 |
| V27' | SS6, SS7 | S1, S4 | V59' | SS14, SS15 | S1, S4 |
| V28' | SS7, SS8 | S4 | V60' | SS15, SS16 | S4 |
| V29' | SS7, SS8 | S1, S4 | V61' | SS15, SS16 | S1, S4 |
| V30' | SS7, SS8 | S1, S3 | V62' | SS15, SS16 | S1, S3 |
| V31' | SS7, SS8 | S1, S2 | V63' | SS15, SS16 | S1, S2 |

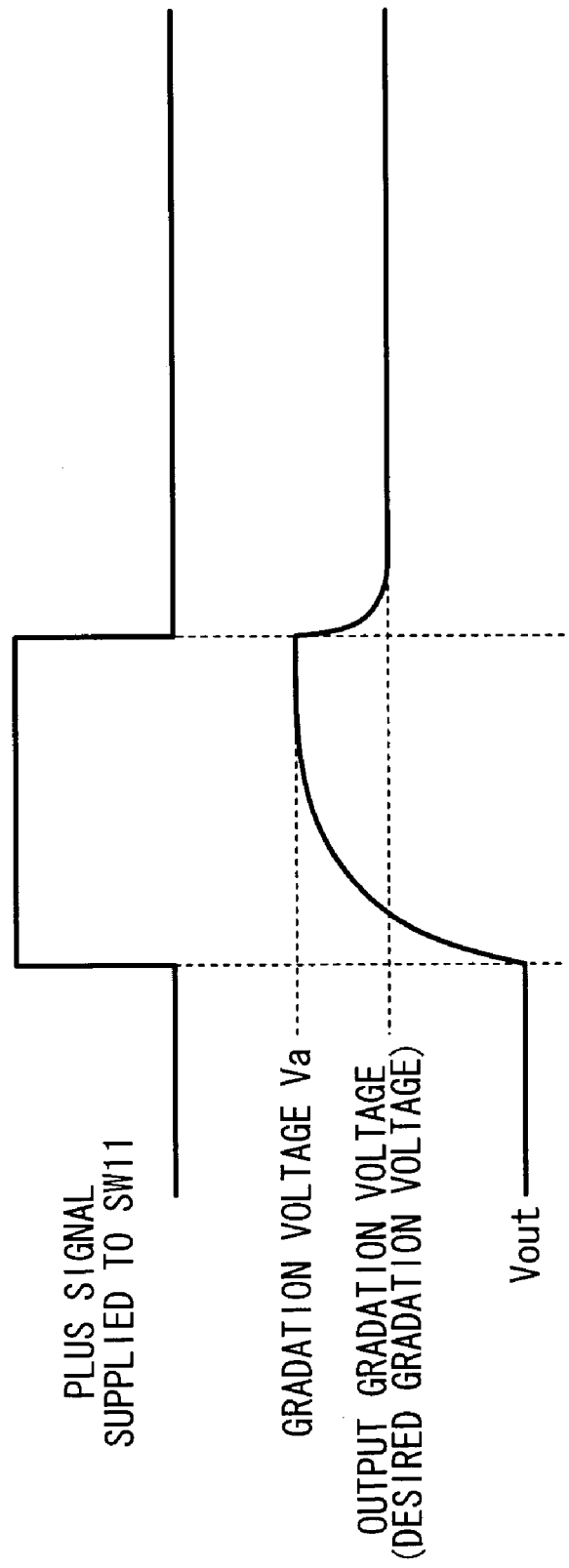

GRADATION VOLTAGE SELECTING CIRCUIT, DRIVER CIRCUIT, LIQUID CRYSTAL DRIVE CIRCUIT, AND LIQUID CRYSTAL DISPLAY DEVICE

BACKGROUND OF THE INVENTION

1. Field of the Invention

The present invention relates to a gradation voltage selecting circuit, a driver circuit, a liquid crystal drive circuit and a liquid crystal display device. More particularly, the present invention relates to the gradation voltage selecting circuit, the driver circuit, the liquid crystal drive circuit and the liquid crystal display device which is used for a capacitive load exemplified in a liquid crystal panel.

2. Description of the Related Art

In recent years, Liquid crystal display devices have been used for a mobile electronic apparatus exemplified by a portable telephone. When the liquid crystal display devices are used for the mobile electronic apparatus, the liquid crystal display device is required to have a thin structure and a property of lower power consumption. Also, the liquid crystal display device is required to have the small circuit scale (chip size).

FIG. 1 is a block diagram showing the configuration of a liquid crystal display device of the related art. This liquid crystal display device is composed of a liquid crystal drive circuit provided on a chip, and a display portion 101 as a liquid crystal panel.

The liquid crystal drive circuit is composed of m-pieces gate driver circuits 102-1 to 102-$m$ (m is an integer of 2 or more), n-pieces source driver circuits 103-1 to 103-$n$ (n is an integer of 2 or more), and a power supply circuit 104.

The display portion 101 includes (m×n)-pieces pixels 110. Each of the (m×n)-pieces pixels 110 includes a pixel electrode 111, a counter electrode 112 opposed to the pixel electrode 111, and a thin film transistor (TFT) 113 of which the drain is connected to the pixel electrode 111.

The gate driver circuits 102-1 to 102-$m$ are respectively connected to the display portion 101 through gate lines 105-1 to 105-$m$. The gate line 105-$i$ (i=1, 2, - - -, m) is connected to the gates of the thin film transistors 113 of the n-pieces pixels 110 belonging to the i-th row among m rows. The first to the m-th gate control signal 107 in one horizontal period is supplied respectively to the gate driver circuits 102-1 to 102-$m$ from the outside in this order. The gate driver circuit 102-$i$ outputs a scanning voltage to the display portion 101 through the gate line 105-$i$ in response to the gate control signal 107 from the outside.

The power supply circuit 104 includes a plurality of resistive elements connected in series. The power supply circuit 104 voltage-divides an external voltage and a ground voltage by using the plurality of resistive elements, and generates X-pieces (for example; X=9) different reference voltages. The X-pieces reference voltages are supplied to n-pieces source driver circuits 103-1 to 103-$n$.

The source driver circuits 103-1 to 103-$n$ are respectively connected to the display portion 101 through signal lines 106-1 to 106-$n$. The signal line 106-$j$ (j-1, 2, - - -, n) is connected to the sources of the thin film transistors 113 of m-pieces pixels 110 belonging to the j-th column among the n columns. The X-pieces reference voltages are respectively supplied to the source driver circuits 103-1 to 103-$n$ from the power supply circuit 104. A source control signal 108 and display data D1 to Dn are respectively supplied to the source driver circuits 103-1 to 103-$n$ from the outside in one horizontal period. The display data D1 to Dn are digital gradation data. The source driver circuit 103-$j$ outputs a gradation voltage in response to the display data Dj to the display portion 101 through the signal line 106-$j$ based on the X-pieces reference voltages from the power supply circuit 104 and the source control signal 108 from the outside.

The thin film transistor 113 of the pixel 110 of the i-th row and the j-th column applies the gradation voltage between the pixel electrode 111 and the counter electrode 112 of the pixel 110, when the scanning voltage is applied to the gate line 105-$i$ and the gradation voltage is applied to the signal line 106-$j$.

FIG. 2 is a block diagram showing the configuration of the source driver circuit 103-$j$ of the liquid crystal display device of the related art. The source driver circuit 103-$j$ includes a shift register 121, a data register 122, a latch circuit 123, a level shifter 124, a gradation voltage selecting circuit 125 as a digital/analog (D/A) converter, a buffer amplifier 126 as an output circuit and a series resistance voltage dividing circuit 127. Herein, the above source control signal 108 supplied to the source driver circuit 103-$j$ contains a shift pulse 128 and a transfer clock 129.

The shift register 121 shifts the shift pulse 128 successively synchronizing the shift pulse 128 supplied from the outside with the transfer clock 129. The data register 122 stores the display data Dj from the outside, and outputs the display data Dj to the latch circuit 123 synchronizing the display data Dj with the shift pulse 128 outputted from the shift register 121.

Here, the latch circuit 123 of the source driver circuits 103-1 to 103-$m$ latches the output of the data register 102 of the source driver circuits 103-1 to 103-$m$ with the same timing.

The level shifter 124 converts the level of the output of the latch circuit 123.

The series resistance voltage dividing circuit 127 includes a plurality of resistive elements connected in series. The series resistance voltage dividing circuit 127 voltage-divides the X-pieces reference voltages from the power supply circuit 104 by using the plurality of resistive elements, and generates Y different gradation voltages (Y>X).

The gradation voltage selecting circuit 125 generates Z-pieces output gradation voltages (Z>Y) based on the Y-pieces gradation voltages generated by the series resistance voltage dividing circuit 127, and the output (display data Dj) of the level shifter 124. The gradation voltage selecting circuit 125 selects the output gradation voltage in response to the display data Dj among the Z-pieces output gradation voltage. The buffer amplifier 126 outputs the output gradation voltage selected by the gradation voltage selecting circuit 125 to the signal line 106-$j$.

FIG. 3 is a block diagram showing the configurations of the series resistance voltage dividing circuit 127 and gradation voltage selecting circuit 125 of the source driver circuit 103-$j$ of the liquid crystal display device of the related art. The gradation voltage selecting circuit 125 is obtained by simplifying the gradation voltage selecting circuit described in Japanese Laid Open Patent Application H09-198012A (1997).

First, the series resistance voltage dividing circuit 127 will be explained.

Herein, above X is set to 9, and the X-pieces reference voltages are expressed as the reference voltages V0 to V8. The plurality of resistive elements of the series resistance voltage dividing circuit 127 are expressed as the resistive elements R0 to R15 connected in series.

Nodes T0 to T15 are respectively connected to one terminal of both terminals of the resistive elements R0 to R15. Nodes T1 to T16 are respectively connected to the other terminals of the resistive elements R0 to R15. The reference voltages V0 to V8 are respectively applied to even numbered nodes T0, T2, T4, T6, T8, T10, T12, T14 and T16 among the nodes T1 to T16.

Next, the gradation voltage selecting circuit 125 will be explained. The gradation voltage selecting circuit 125 includes a gradation voltage control portion 130, a first switching portion 131, a half gradation voltage generating portion 132 and a second switching portion 133.

Herein, the above Y is expressed as 17.

The first switching portion 131 contains Y-pieces switches S00 to S16 as an MOS transistor. The nodes T0 to T16 are respectively connected to the one ends of the switches S00 to S16. A node Ta is connected to the other ends of the switches S00, S02, S04, S06, S08, S10, S12, S14 and S16. A node Te is connected to the other ends of switches S01, S03, S05, S07, S09, S11, S13, and S15.

The half gradation voltage-generating portion 132 contains a plurality of resistive elements Ra, Rb, Rc, and Rd connected in series. The nodes Ta, Tb, Tc and Td are respectively connected to one terminal of both terminals of the resistive elements Ra, Rb, Rc and Rd. The nodes Tb, Tc, Td, and Te are respectively connected to the other terminals of the resistive elements Ra, Rb, Rc, and Rd.

The second switching portion 133 contains a plurality of switches Sa, Sb, Sc, Sd, and Se as the MOS transistor. The nodes Ta, Tb, Tc, Td and Te are respectively connected to the one ends of the switches Sa, Sb, Sc, Sd and Se. The buffer amplifier 126 is connected to the other ends of the plurality of switches Sa, Sb, Sc, Sd, and Se through a node Tout.

Herein, the above Z is set to 64, and the Z-pieces output gradation voltages are expressed as the output gradation voltages V00' to V63'.

The gradation voltage control portion 130 performs a control shown in FIG. 4 to the first switching portion 131 and the second switching portion 133 so as to select the output gradation voltage in response to the display data Dj among the output gradation voltages V00' to V63'.

For example, when the output gradation voltage in response to the display data Dj is V00', the gradation voltage control portion 130 outputs a control signal to the switches S00, S01 and Sa as shown in FIG. 4.

At this time, the switch S00 is turned on in response to the control signal, and selects the gradation voltage applied to the node T0. The gradation voltage selected by the switch S00 is applied to the node Ta.

The switch S01 is turned on in response to the control signal, and selects the gradation voltage applied to the node T1. The gradation voltage selected by the switch S01 is applied to the node Te.

The half gradation voltage generating portion 132 voltage-divides the gradation voltage between the gradation voltage applied to the node Ta and the gradation voltage applied to the node Te into four equal parts, and generates three half gradation voltages. The three half gradation voltages are respectively applied to the nodes Tb, Tc and Td.

The switch Sa is turned on in response to the control signal, and outputs the gradation voltage applied to the node Ta as the output gradation voltage V00'. The output gradation voltage V00' is applied to the node Tout, and is supplied to the buffer amplifier 126.

When the output gradation voltage in response to the display data Dj is V01', the gradation voltage control portion 130 outputs the control signal to the switches S00, S01 and Sb as shown in FIG. 4.

At this time, the switch S00 is turned on in response to the control signal, and selects the gradation voltage applied to the node T0. The gradation voltage selected by the switch S00 is applied to the node Ta.

The switch S01 is turned on in response to the control signal, and selects the gradation voltage applied to the node T1. The gradation voltage selected by the switch S01 is applied to the node Te.

The half gradation voltage generating portion 132 voltage-divides the gradation voltage between the gradation voltage applied to the node Ta and the gradation voltage applied to the node Te into four equal parts, and generates the three half gradation voltages. The three half gradation voltages are respectively applied to the nodes Tb, Tc and Td.

The switch Sb is turned on in response to the control signal, and outputs the gradation voltage applied to the node Tb as the output gradation voltage V01'. The output gradation voltage V01' is applied to the node Tout, and is supplied to the buffer amplifier 126.

However, the half gradation voltage generating portion 132 (resistive elements Ra, Rb, Rc and Rd) is arranged in parallel with series resistance voltage dividing circuit 127 (resistive elements R0 to R15). Therefore, there are problems in that the voltage levels of the output gradation voltages V00' to V63' are fluctuated by the error of a current flowing in the half gradation voltage generating portion 132. Thus, although the resistance values of the resistive elements R0 to R15 of the series resistance voltage dividing circuit 127 are usually tens of ohms to hundreds of ohms, the required resistance values of the resistive elements Ra, Rb, Rc and Rd of the half gradation voltage generating portion 132 are several mega ohms or more (for example, 1 mega ohm).

The number of outputs of the source driver circuit (source driver circuits 103-1 to 103-$n$) is several hundreds or more due to increasing resolution of the display portion 101 in recent years. That is, the above n is a value of several hundreds or more. When the source driver circuits 103-1 to 103-$n$ select the same output gradation voltage simultaneously, an extremely high value of several mega ohms or more is required as the resistance values of the resistive elements Ra, Rb, R and, Rd of the half gradation voltage generating portion 132 so as to suppress the error of the current flowing in the half gradation voltage generating portion 132.

The size of the resistive element also becomes larger as the resistance value becomes higher. When the resistance values of the resistive elements Ra, Rb, Rc and Rd of the half gradation voltage generating portion 132 are several mega ohms or more, the circuit scale of the gradation voltage selecting circuit 125 becomes larger. The circuit scales of the source driver circuits 103-1 to 103-$n$, and the circuit scale of the liquid crystal drive circuit including the source driver circuits 103-1 to 103-$n$ becomes larger as the circuit scale of the gradation voltage selecting circuit 125 becomes larger. Thus, the chip size of the chip on which the liquid crystal drive circuit is mounted is increased as the circuit scale becomes larger. As described above, the thin liquid crystal display device is required, and the chip size is preferably small.

Above-described gradation voltage selecting circuit 125 is obtained by simplifying the gradation voltage selecting circuit described in Japanese Laid Open Patent Application H09-198012A (1997). Japanese Laid Open Patent Application H09-198012A (1997) is also disclosed another gradation voltage selecting circuit of which the half gradation voltage generating portion 132 is changed into capacitors from the resistive elements. Even in this case, an extremely high value is required as the capacitance value of the capacitor because of the problems of the leak current of the capacitor itself and feed-through of the capacitor. The size of the capacitor also becomes larger as the capacitance value becomes higher. Even in this case, the circuit scale becomes larger, and causes the increase of the chip.

SUMMARY OF THE INVENTION

Therefore, an object of the present invention is to provide a gradation voltage selecting circuit, a driver circuit, a liquid crystal drive circuit and a liquid crystal display device capable of reducing the circuit scale.

In order to achieve an aspect of the present invention, the present invention provides a gradation voltage selecting circuit comprising: a plurality of gradation selecting MOS transistor groups, each of which corresponds to one of plurality of gradation voltages; M-pieces (M is a positive integer) half gradation voltage generating MOS transistor groups which are connected each to other in series; a switching portion; and a control portion which supplies a first control signal in response to a first display data, and supplies a second control signal in response to a second display data, wherein a first gradation selecting MOS transistor group as one of said plurality of gradation selecting MOS transistor groups selects a first gradation voltage corresponding to said first gradation selecting MOS transistor group in response to one of said first and second control signals, a second gradation selecting MOS transistor group as one of said plurality of gradation selecting MOS transistor groups selects a second gradation voltage corresponding to said second gradation selecting MOS transistor group in response to one of said first and second control signals, said first and second gradation selecting MOS transistor groups and said M-pieces half gradation voltage generating MOS transistor groups voltage-divide a gradation voltage between said first gradation voltage and said second gradation voltage into (M+2) equal parts in response to said second control signal, and generate (M+1)-pieces half gradation voltages, said switching portion outputs said first gradation voltage selected by said first gradation selecting MOS transistor group into a display portion in response to said first control signal, and selects and outputs one of said (M+1)-pieces half gradation voltage into the display portion in response to said second control signal, and said (M+1)-pieces half gradation voltages are determined by ON resistance of said first and second gradation selecting MOS transistor groups and said half gradation voltage generating MOS transistor groups.

According to the present invention, the high resistance of several mega ohms or more can be obtained by using the ON resistance of the MOS transistors (MOS transistor group) without using the resistive elements having the resistance value of several mega ohms or more in the gradation voltage selecting circuit. The area of the MOS transistors is much smaller than that of the resistive elements. Therefore, the circuit scale of the gradation voltage selecting circuit, the circuit scale of the source driver circuit, and the circuit scale of the liquid crystal drive circuit can be reduced from those of the related art.

Since the circuit scale can be reduced according to the gradation voltage selecting circuit, driver circuit, liquid crystal drive circuit and liquid crystal display device of the present invention, the chip size of the chip on which the liquid crystal drive circuit is mounted can be reduced, and the liquid crystal display device can satisfy the needs of thin type.

BRIEF DESCRIPTION OF THE DRAWINGS

The above and other objects, advantages and features of the present invention will be more apparent from the following description taken in conjunction with the accompanying drawings, in which:

FIG. 4 is a table showing an operation of the gradation voltage selecting circuit of the liquid crystal display device of the related art;

FIG. 8 is a table showing an operation of the gradation voltage selecting circuit of the liquid crystal display device according to the first embodiment of the present invention;

FIG. 14 is a graph showing the pre-charge operation of the gradation voltage selecting circuit of the source driver circuit of the liquid crystal display device according to the fourth embodiment of the present invention.

DESCRIPTION OF THE PREFERRED EMBODIMENTS

Embodiments of a liquid crystal display device to which a gradation voltage selecting circuit is applied according to the present invention will be described below with reference to the attached drawings.

First Embodiment

Figure 1:
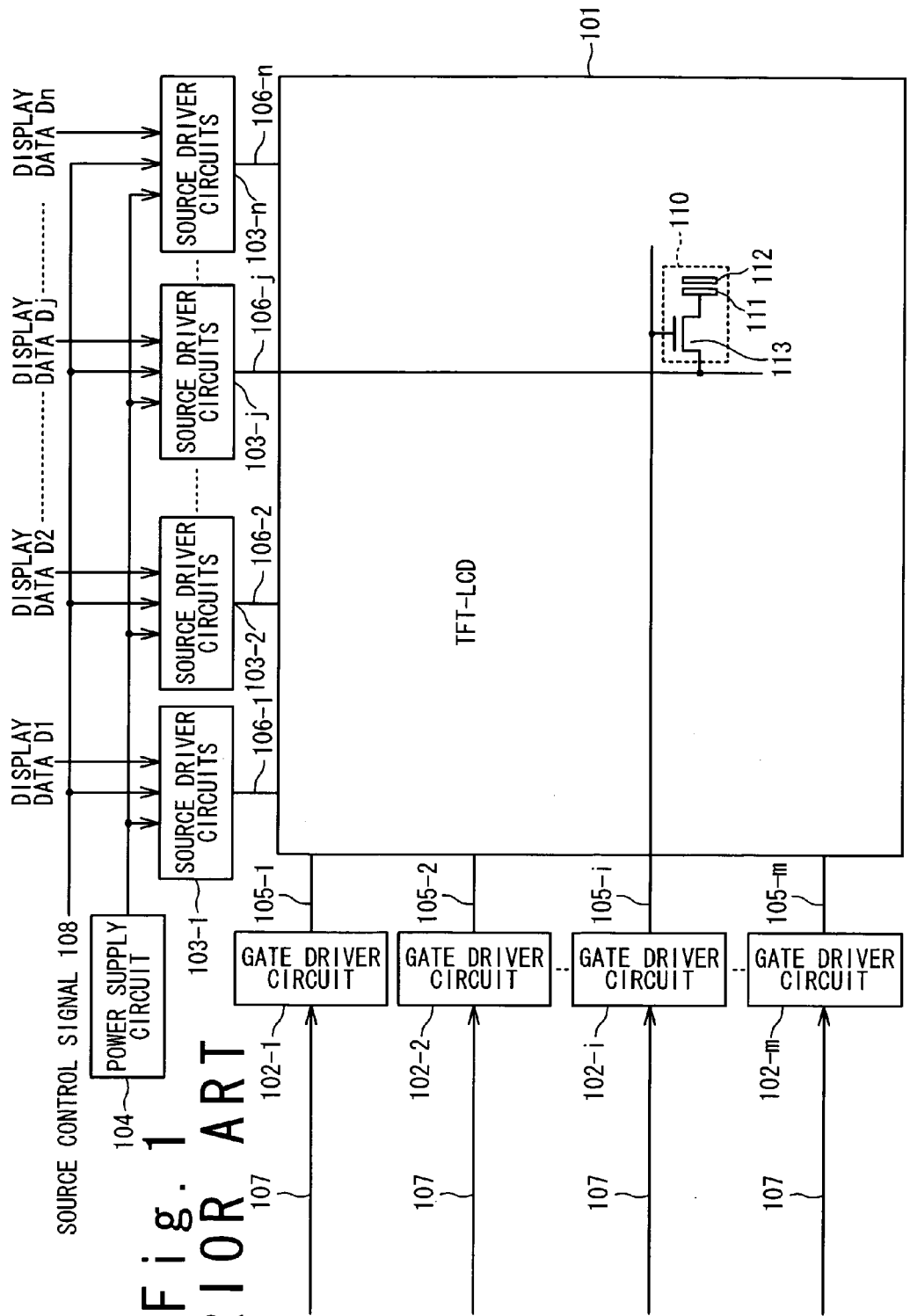
FIG. 1 is a block diagram showing the configuration of a liquid crystal display device of the related art.
Figure 2:
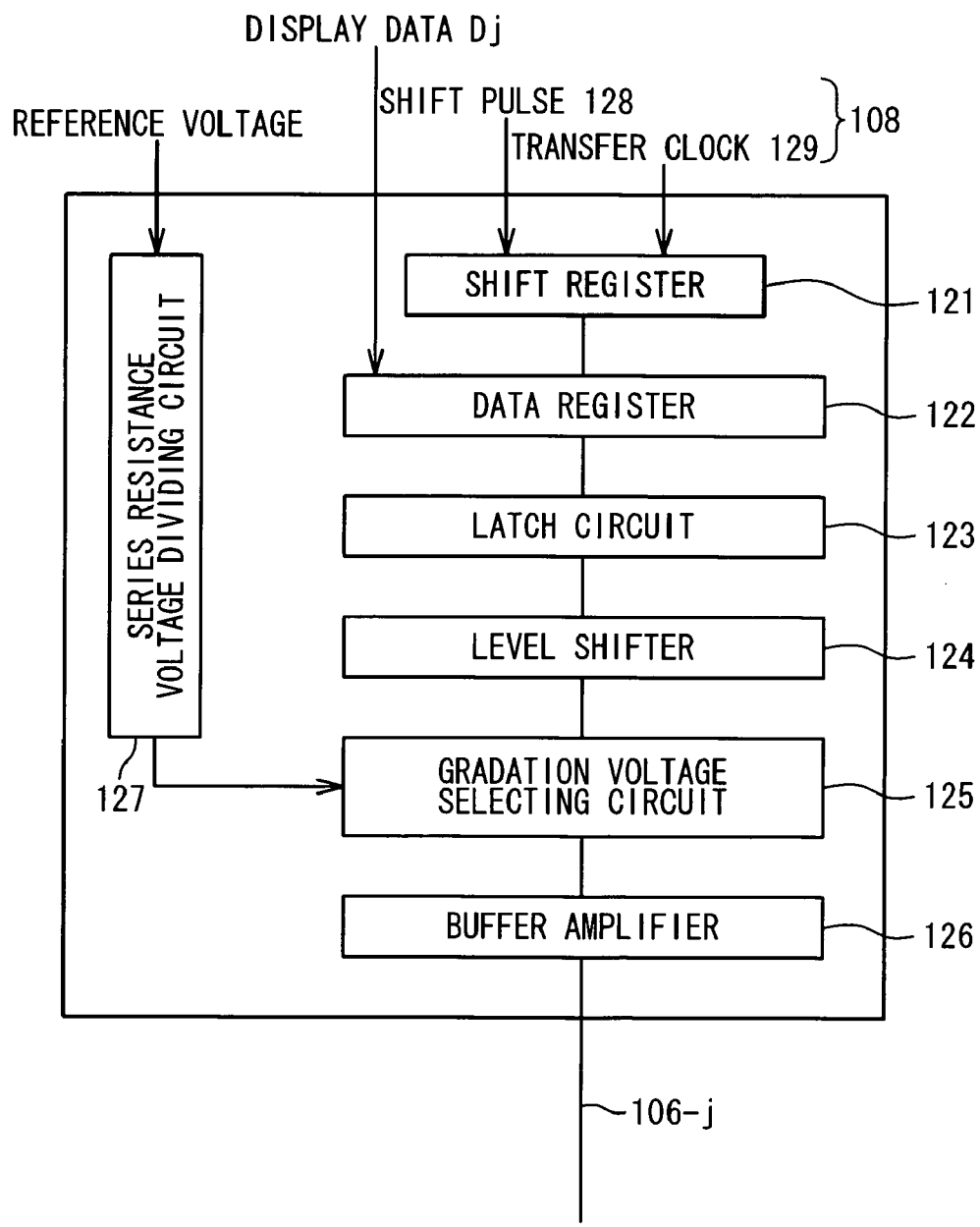
FIG. 2 is a block diagram showing the configuration of the source driver circuit of the liquid crystal display device of the related art.
Figure 3:
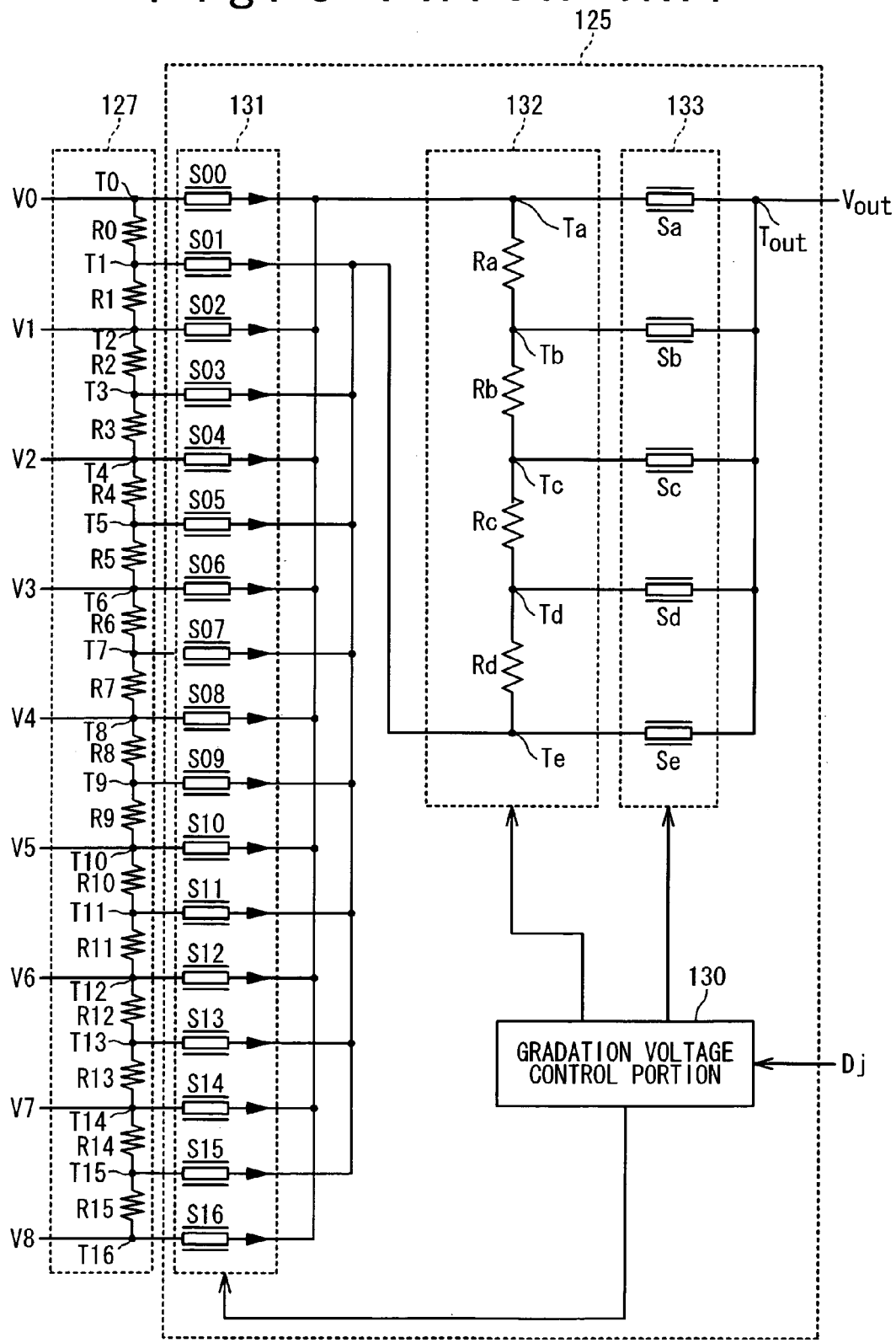
FIG. 3 is a block diagram showing the configurations of the series resistance voltage dividing circuit and gradation voltage selecting circuit of the liquid crystal display device of the related art.
Figure 5:
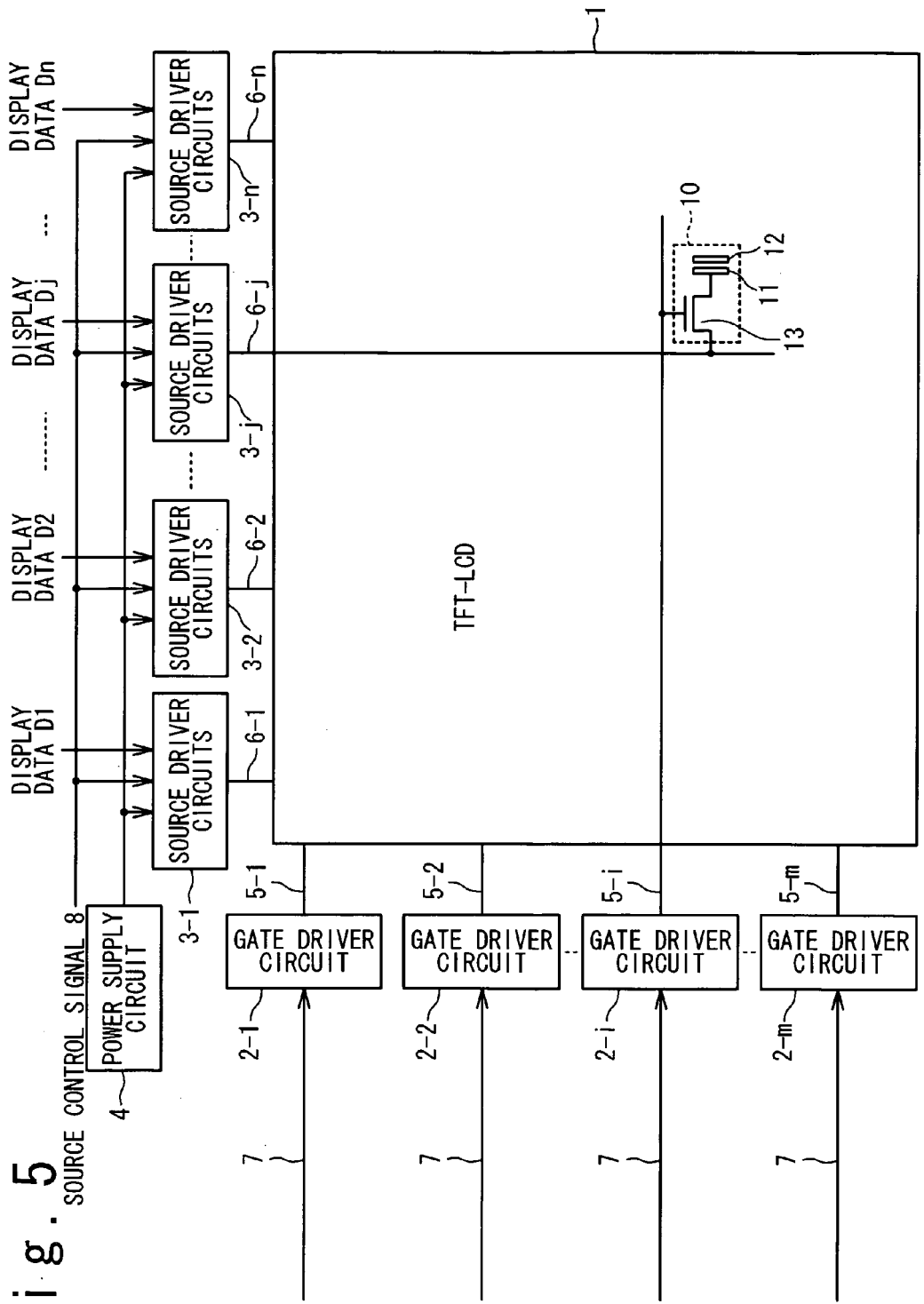
FIG. 5 is a block diagram showing the configuration of a liquid crystal display device according to the first embodiment of the present invention.

The first embodiment of a liquid crystal display device according to the present invention will be described below with reference to the attached drawings. FIG. 5 is a block diagram showing the configuration of a liquid crystal display device according to the first embodiment of the present invention. The liquid crystal display device includes a liquid crystal drive circuit formed on a chip, and a display portion 1 as a liquid crystal panel.

The liquid crystal drive circuit includes m-pieces gate driver circuits 2-1 to 2-$m$ (m is an integer of 2 or more), n-pieces source driver circuits 3-1 to 3-$n$ (n is an integer of 2 or more), and a power supply circuit 4.

The display portion 1 includes (m×n)-pieces pixels 10. Each of the (m×n)-pieces pixels 10 includes a pixel electrode 11, a counter electrode 12 opposed to the pixel electrode 11, and a thin film transistor (TFT) 13 of which the drain is connected to the pixel electrode 11.

The gate driver circuits 2-1 to 2-$m$ are respectively connected to the display portion 1 through gate lines 5-1 to 5-$m$. The gate line 5-$i$ (i=1, 2, - - -, m) is connected to gates of the thin film transistor 13 of n-pieces pixels 10 belonging to the i-th row of m rows. The first to the m-th gate control signals 7 in one horizontal period are supplied respectively to the gate driver circuits 2-1 to 2-$m$ from the outside in this order. The gate driver circuit 2-$i$ outputs a scanning voltage to the display portion 1 through the gate line 5-$i$ in response to the gate control signal 7 from the outside.

The power supply circuit 4 is provided with a plurality of resistive elements connected in series. The power supply circuit 4 voltage-divides an external voltage and a ground voltage by using the plurality of resistive elements, and generates X-pieces (for example; X=9) different reference voltages. The X-pieces reference voltages are supplied to n-pieces source driver circuits 3-1 to 3-$n$.

The source driver circuits 3-1 to 3-$n$ are respectively connected to the display portion 1 through signal lines 6-1 to 6-$n$. The signal line 6-$j$ (j-1, 2, - - -, n) is connected to the sources of the thin film transistors 13 of m-pieces pixels 10 belonging to the j-th column among the n columns. The X-pieces reference voltages are respectively supplied to the source driver circuits 3-1 to 3-$n$ from the power supply circuit 4. A source control signal 8 and display data D1 to Dn are respectively supplied to the source driver circuits 3-1 to 3-$n$ from the outside in one horizontal period. The display data D1 to Dn are digital gradation data. The source driver circuit 3-$j$ outputs a gradation voltage in response to the display data Dj to the display portion 1 through the signal line 6-$j$ based on the X-pieces reference voltages from the power supply circuit 4 and the source control signal 8 from the outside.

The thin film transistor 13 of the pixel 10 of the i-th line and the j-th column applies the gradation voltage between the pixel electrode 11 and the counter electrode 12 of the pixel 10, when the scanning voltage is applied to the gate line 5-$i$ and the gradation voltage is applied to the signal line 6-$j$.

Figure 6:
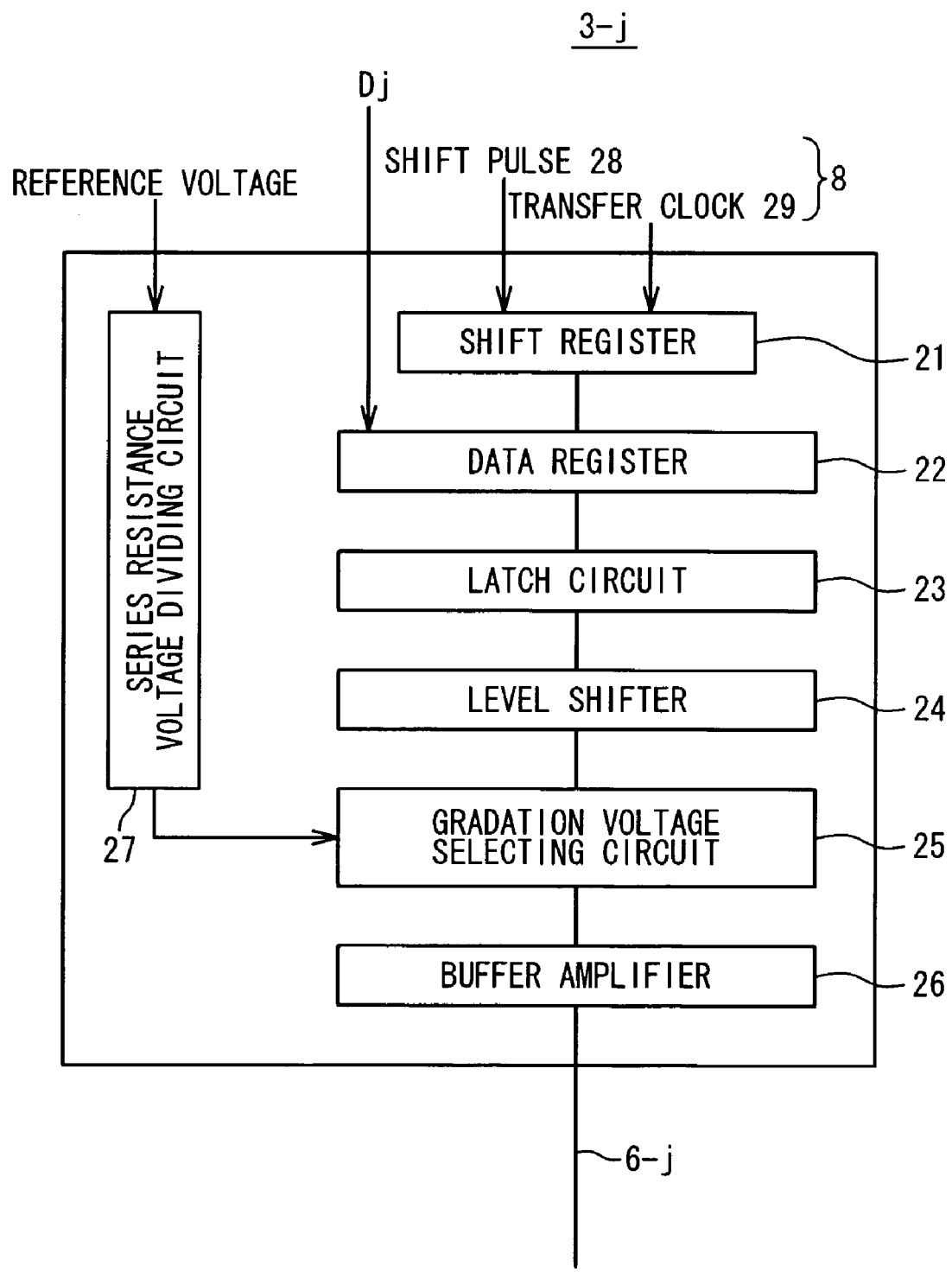
FIG. 6 is a block diagram showing the configuration of the source driver circuit 3-$j$ of the liquid crystal display device according to the first embodiment of the present invention.

FIG. 6 is a block diagram showing the configuration of the source driver circuit 3-$j$ of the liquid crystal display device according to the first embodiment of the present invention. The source driver circuit 3-$j$ includes a shift register 21, a data register 22, a latch circuit 23, a level shifter 24, a gradation voltage selecting circuit 25 as a digital/analog (D/A) converter, a buffer amplifier 26 as an output circuit and a series resistance voltage dividing circuit 27. Herein, the above source control signal 8 supplied to the source driver circuit 3-$j$ contains a shift pulse 28 and a transfer clock 29.

The shift register 21 shifts the shift pulse 28 supplied from the outside successively synchronizing the shift pulse 28 with the transfer clock 29. The data register 22 stores the display data Dj from the outside, and outputs the display data Dj to the latch circuit 23 synchronizing the display data Dj with the shift pulse 28 outputted from the shift register 21.

Here, the latch circuit 23 of the source driver circuits 3-1 to 3-$m$ latches the output of the data register 2 of the source driver circuits 3-1 to 3-$m$ with the same timing.

The level shifter 24 converts the level of the output of the latch circuit 23.

The series resistance voltage dividing circuit 27 inculdes a plurality of resistive elements connected in series. The series resistance voltage dividing circuit 27 voltage-divides the X-pieces reference voltages from the power supply circuit 4 by using the plurality of resistive elements, and generates Y-pieces different gradation voltages (Y>X).

The gradation voltage selecting circuit 25 generates Z-pieces output gradation voltages (Z>Y) based on the Y-pieces gradation voltages generated by the series resistance voltage dividing circuit 27, and the output (display data Dj) of the level shifter 24. The gradation voltage selecting circuit 25 selects the output gradation voltage in response to the display data Dj among the Z-pieces output gradation voltages. The buffer amplifier 26 outputs the output gradation voltage selected by the gradation voltage selecting circuit 25 to the signal line 6-$j$.

Figure 7:
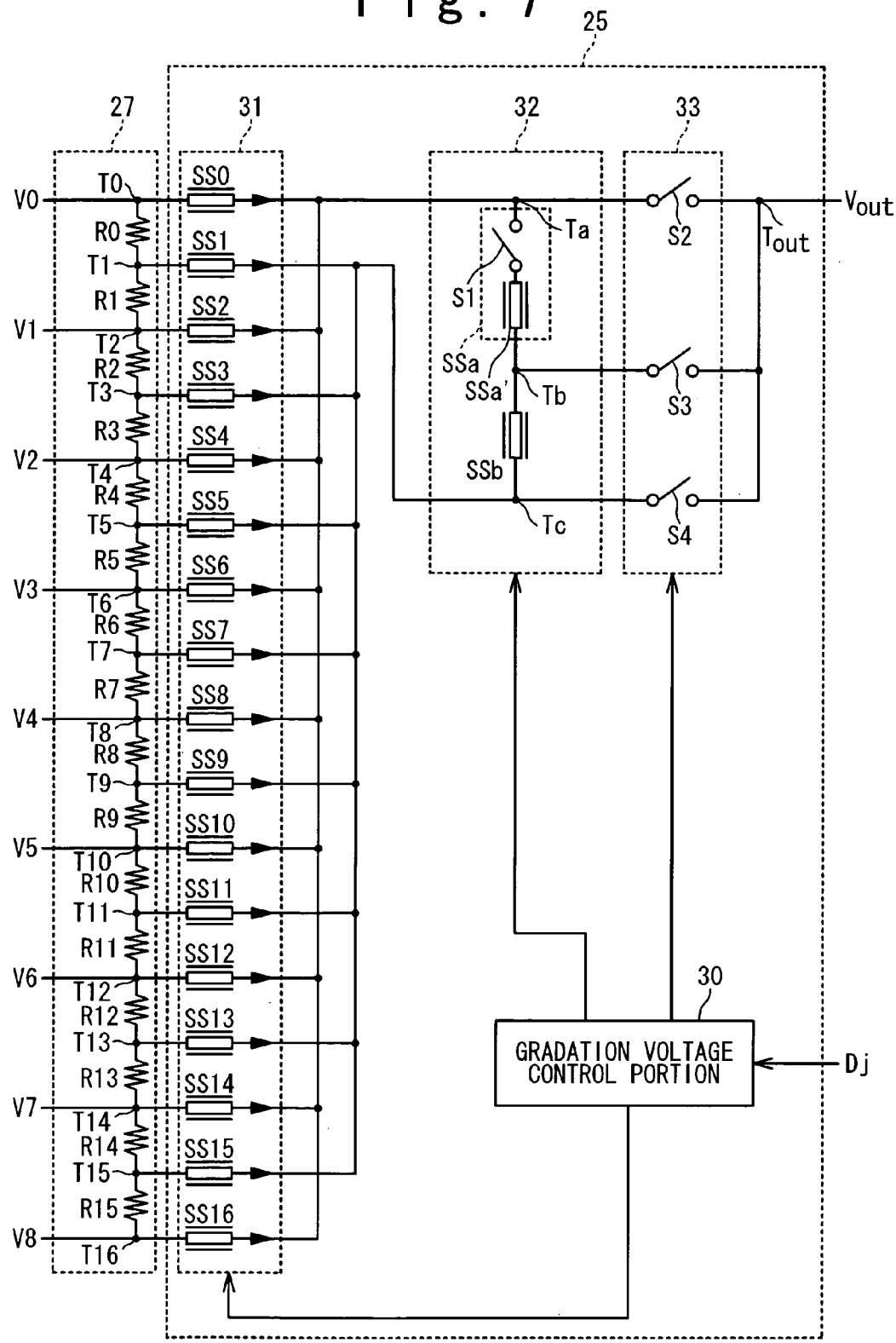
FIG. 7 is a block diagram showing the configurations of the series resistance voltage dividing circuit and gradation voltage selecting circuit of the liquid crystal display device according to the first embodiment of the present invention.

FIG. 7 is a block diagram showing the configurations of the series resistance voltage dividing circuit and gradation voltage selecting circuit of the liquid crystal display device according to the first embodiment of the present invention. As shown in FIG. 7, the gradation voltage selecting circuit 25 includes a gradation voltage control portion 30, a gradation selecting portion 31, a half gradation voltage generating portion 32 and a switching portion 33.

The gradation selecting portion 31 contains Y-pieces gradation selecting MOS transistor groups corresponding to the Y-pieces gradation voltages. Each of Y-pieces gradation selecting MOS transistor groups is composed of N-pieces MOS transistors (N is an integer of 2 or more) connected in series. A first control signal or a second control signal is supplied to a first gradation selecting MOS transistor group and a second gradation selecting MOS transistor group among the Y-pieces gradation selecting MOS transistor groups from the gradation voltage control portion 30.

The half gradation voltage generating portion 32 contains M-pieces half gradation voltage generation MOS transistor groups (M is an integer of 1 or more) connected in series. Each of the M-pieces half gradation voltage generation MOS transistor groups is composed of the N-pieces MOS transistors connected in series At least one of the M-pieces half gradation voltage generation MOS transistor groups is a half gradation voltage generation MOS transistor group for control. The second control signal is supplied to J-pieces MOS transistors (J is an integer satisfying 1≦J≦N) of the half gradation voltage generation MOS transistor group for control from the gradation voltage control portion 30.

A third control signal for always turning on is supplied to the (N-J)-pieces MOS transistors of the half gradation voltage generation MOS transistor group for control. The third control signal is supplied to the N-pieces MOS transistors of the half gradation voltage generation MOS transistor groups other than the half gradation voltage generation MOS transistor group for control among the M-pieces half gradation voltage generation MOS transistor groups.

The switching portion 33 includes the (M+1)-pieces switches as the MOS transistor.

When the display data Dj from the level shifter 24 expresses the first display data, the gradation voltage control portion 30 supplies the first control signal to the first gradation selecting MOS transistor group and the second gradation selecting MOS transistor group among the Y-pieces gradation selecting MOS transistor groups in response to the first display data, and supplies the first control signal to a first switch among the (M+1)-pieces switches of the switching portion 33.

At this time, in response to the first control signal, the first gradation selecting MOS transistor group selects the first gradation voltage among the Y-pieces gradation voltages, and the second gradation selecting MOS transistor group selects the second gradation voltage next to the first gradation voltage among the Y-pieces gradation voltages. The first switch outputs the first gradation voltage selected by the first gradation selecting MOS transistor group in response to the first control signal. The first gradation voltage outputted by the first switch is outputted to the buffer amplifier 26 as one output gradation voltage among the above Z-pieces output gradation voltages.

The gradation voltage control portion 30 supplies the second control signal to the first gradation selecting MOS transistor group and the second gradation selecting MOS transistor group among the Y-pieces gradation selecting MOS transistor groups in response to the second display data when the display data Dj from the level shifter 24 expresses second display data, and supplies to J-pieces MOS transistors of the half gradation voltage generation MOS transistor group for control and the I-th ((I is an integer satisfying $1 \leq I \leq M+1$) switch among the (M+1) switches of the switching portion 33.

At this time, in response to the second control signal, the first gradation selecting MOS transistor group selects the first gradation voltage among the Y-pieces gradation voltage, and the second gradation selecting MOS transistor group selects the second gradation voltage next to the first gradation voltage among the Y-pieces gradation voltage. When the second control signal is supplied to the J-pieces MOS transistors of the half gradation voltage generation MOS transistor group for control, the first gradation selecting MOS transistor group, the M-pieces half gradation voltage generation MOS transistor groups, and the second gradation selecting MOS transistor group are connected in this order. At this time, the first gradation selecting MOS transistor group, the M-pieces half gradation voltage generation MOS transistor groups, and the second gradation selecting MOS transistor group voltage-divide the gradation voltage between the first gradation voltage and the second gradation voltage into (M+2) equal parts in response to the second control signal, and generate the (M+1)-pieces half gradation voltages. The (M+1)-pieces half gradation voltages are determined by the ON resistances of the first gradation selecting MOS transistor group, the M-pieces half gradation voltage generation MOS transistor groups and the second gradation selecting MOS transistor groups. The I-th switch selects and outputs the I-th half gradation voltage among the (M+1)-pieces half gradation voltages in response to the second control signal. The I-th half gradation voltage outputted by the I-th switch is outputted to the buffer amplifier 26 as one output gradation voltage among the above Z-pieces output gradation voltages.

In the source driver circuit 3-j, the half gradation voltage generating portion 32 (M-pieces half gradation voltage generation MOS transistor groups) is provided in parallel with the series resistance voltage dividing circuit 27 (resistive element). The resistance value of the resistive element of the series resistance voltage dividing circuit 27 is usually several tens of ohms to several hundreds ohms. Therefore, the resistance value of the half gradation voltage generating portion 32 of several mega ohms or more is required so that the voltage level of each output gradation voltage is not fluctuated.

In the gradation voltage selecting circuit 25 of the liquid crystal display device of the present invention, the first gradation selecting MOS transistor group, the M-pieces half gradation voltage generation MOS transistor groups and the second gradation selecting MOS transistor group voltage-divide the gradation voltage between the first gradation voltage and the second gradation voltage into (M+2) equal parts in response to the second control signal, and generate the (M+1)-pieces half gradation voltages. At this time, a high resistance of several mega ohms or more can be obtained by the ON resistances of the first gradation selecting MOS transistor group, the M-pieces half gradation voltage generation MOS transistor groups, and the second gradation selecting MOS transistor group. Therefore, the voltage level of each output gradation voltage is not fluctuated.

In the liquid crystal display device of the present invention, as mentioned above, the high resistance of several mega ohms or more can be obtained by the above ON resistance without using the resistive element having the resistance value of several mega ohms or more in the gradation voltage selecting circuit 25. Therefore, the circuit scale of the gradation voltage selecting circuit 25 can be reduced rather than that of the related art. In the liquid crystal display device of the present invention, the circuit scale of the source driver circuits 3-1 to 3-n, and the circuit scale of the liquid crystal drive circuit provided with the source driver circuits 3-1 to 3-n can be reduced rather than that of the related art.

Thus, since the circuit scale can be reduced in the liquid crystal display device of the present invention, the chip size of the chip on the liquid crystal drive circuit is mounted can be reduced, and the liquid crystal display device can satisfy the needs of thin type.

In the liquid crystal display device of the present invention, the above ON resistance is generated by using a resistance (polyresistor) due to the poly wiring of the upper layer of the MOS transistor constituting the first gradation selecting MOS transistor group, M-pieces half gradation voltage generation MOS transistor groups and the second gradation selecting MOS transistor group. Therefore, even though there is a large number of M, the area of the MOS transistor itself is not increased. For example, the polyresistor is about 300 kΩ.

The configurations of the series resistance voltage dividing circuit 27 and gradation voltage selecting circuit 25 will be specifically explained using FIG. 7.

First, the series resistance voltage dividing circuit 27 will be explained.

Herein, above-described X is set to 9, and the X-pieces reference voltages are expressed as the reference voltages V0 to V8. A plurality of resistive elements included in the series resistance voltage dividing circuit 27 are expressed as the resistive elements R0 to R15 connected in series.

The nodes T0 to T15 are respectively connected to one terminal of both terminals of the resistive elements R0 to R15. Nodes T1 to T16 are respectively connected to the other terminals of the resistive elements R0 to R15. The reference voltages V0 to V8 are respectively applied (supplied) to even numbered nodes T0, T2, T4, T6, T8, T10, T12, T14 and T16 among the nodes T1 to T16.

Next, the gradation selecting portion 31 of the gradation voltage selecting circuit 25 will be explained.

Herein, the above-mentioned Y is set to 17, and the Y-pieces gradation selecting MOS transistor groups of the gradation selecting portion 31 are expressed as the gradation selecting MOS transistor groups SS0 to SS16.

The nodes T0 to T16 are respectively connected to the first-stage MOS transistors of the gradation selecting MOS transistor groups SS0 to SS16. A node Ta is connected to the final-stage MOS transistors of the gradation selecting MOS transistor groups SS0, SS2, SS4, SS6, SS8, SS10, SS12, SS14, and SS16. A node Tc is connected to the final-stage MOS transistors of the gradation selecting MOS transistor groups SS1, SS3, SS5, SS7, SS9, SS11, SS13, and SS15.

Next, the half gradation voltage generating portion 32 of the gradation voltage selecting circuit 25 will be explained.

Herein, the above-mentioned M is set to 2, and the M-pieces half gradation voltage generation MOS transistor groups of the half gradation voltage generating portion 32 are expressed as half gradation voltage generation MOS transistor groups SSa and SSb.

The nodes Ta and Tb are respectively connected to the first-stage MOS transistors of the half gradation voltage generation MOS transistor groups SSa and SSb. Nodes Tb and Tc are respectively connected to the final-stage MOS transistors of the half gradation voltage generation MOS transistor groups SSa and SSb.

The above-mentioned half gradation voltage generation MOS transistor group for control is made to the half gradation voltage generation MOS transistor group SSa.

The above-mentioned J is set to 1, and the J-pieces MOS transistors of the half gradation voltage generation MOS transistor group SSa are referred to as "switch S1" or "MOS transistor S1".

The (N-J)-pieces MOS transistors of the half gradation voltage generation MOS transistor group SSa are referred to as a half gradation voltage generation MOS transistor group SSa'.

When the above-mentioned M is 2, the (M+1)-pieces switches of the switching portion 33 are expressed as switches S2, S3, S4 as the MOS transistor.

The nodes Ta, Tb and Tc are respectively connected to the one ends of the switches S2, S3 and S4. The buffer amplifier 26 is connected to the other ends of the switches S2, S3 and S4 through an output node Tout.

Herein, the above-mentioned Z is set to 64, and the Z-pieces output gradation voltages are expressed as output gradation voltages V00' to V63'.

FIG. 8 is a table showing an operation of the gradation voltage selecting circuit of the liquid crystal display device according to the first embodiment of the present invention. The gradation voltage control portion 30 performs a control shown in FIG. 8 to the gradation selecting portion 31, the half gradation voltage generating portion 32 and the switching portion 33 so as to select the output gradation voltage in response to the display data Dj among the output gradation voltages V00' to V63'.

The operation of the gradation voltage selecting circuit 25 will be explained using FIGS. 8 to 10.

Figure 9:
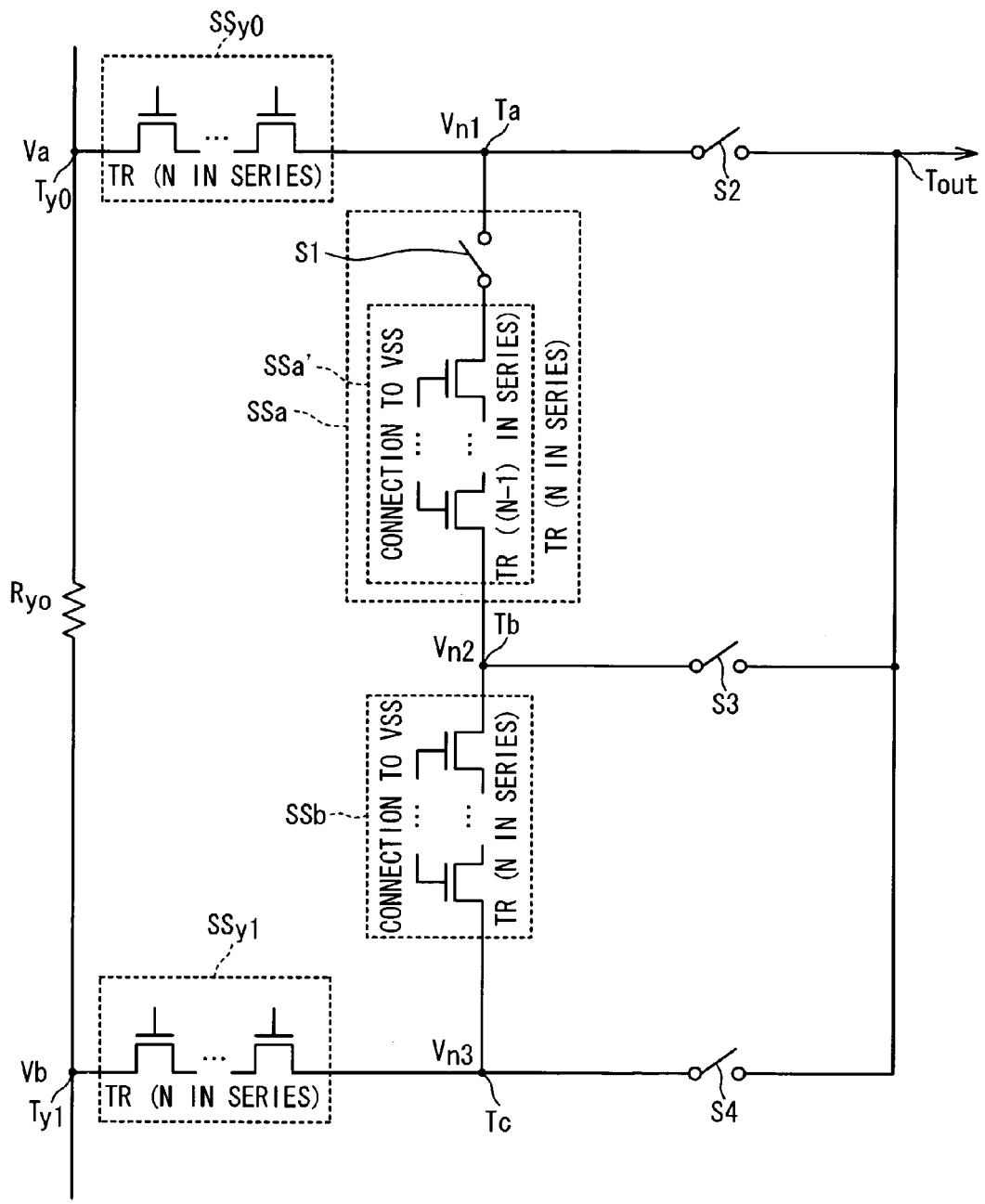
FIG. 9 is a circuit diagram showing a part of the configurations of the series resistance voltage dividing circuit and the gradation voltage selecting circuit of the source driver circuit of the liquid crystal display device according to the first embodiment of the present invention.
Figure 10:
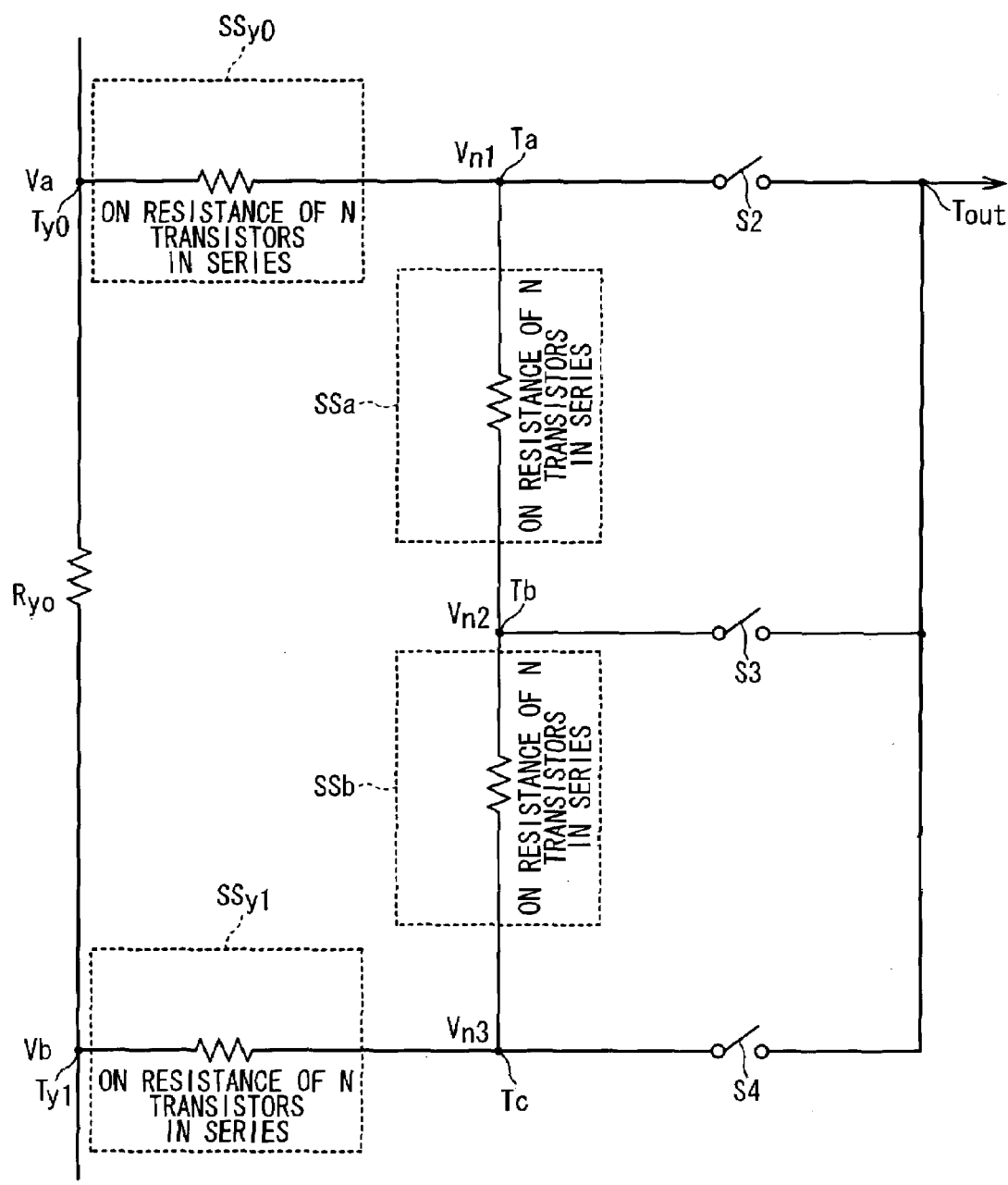
FIG. 10 is a circuit diagram showing a part of the configurations of the series resistance voltage dividing circuit and the gradation voltage selecting circuit of the source driver circuit of the liquid crystal display device according to the first embodiment of the present invention.

Here, FIG. 9 is a circuit diagram showing a part of the configurations of the series resistance voltage dividing circuit and the gradation voltage selecting circuit of the source driver circuit of the liquid crystal display device according to the first embodiment of the present invention. FIG. 10 is a circuit diagram showing a part of the configurations of the series resistance voltage dividing circuit and the gradation voltage selecting circuit of the source driver circuit of the liquid crystal display device according to the first embodiment of the present invention.

Herein, the gradation selecting MOS transistor groups SS0 to SS16 of the gradation selecting portion 31, the half gradation voltage generation MOS transistor groups SSa (half gradation voltage generation MOS transistor group SSa', switch S1) of the half gradation voltage generating portion 32, and the N-pieces MOS transistors of SSb are P type MOS transistors. So as to simplify the explanation, the switches S2, S3 and S4 (MOS transistors) of the switching portion 33 are P type MOS transistors. In this case, the gradation voltage control portion 30 outputs the first control signal or the second control signal at a low level in response to the display data.

A power supply voltage VSS is supplied to the half gradation voltage generation MOS transistor group SSa' as the control signal for always turning on the P type MOS transistor. The power supply voltage VSS is supplied to the gates of the N-pieces MOS transistors of the half gradation voltage generation MOS transistor group SSb.

For example, when the output gradation voltage in response to the display data Dj is Vx0', the gradation voltage control portion 30 outputs the first control signal to the gradation selecting MOS transistor groups SSy0, SSy1 and the switch S2. Herein, as shown in FIGS. 8 and 9, a reference symbol X0 is expressed by 0, 8, 16, 24, 32, 40, 48 or 56. A reference symbol y0 is expressed by 0, 2, 4, 6, 8, 10, 12 and 14 so that the reference symbol y0 corresponds to the reference symbol X0, and a reference symbol y1 is expressed by 1, 3, 5, 7, 9, 11, 13 and 15 so that the reference symbol y1 corresponds to the reference symbol X0. That is, the reference symbol Y1 is a number adjacent to the reference symbol Y0, and is expressed by the formula "y1=y0+1". The gradation selecting MOS transistor group SSy0 corresponds to the above first gradation selecting MOS transistor group, and the gradation selecting MOS transistor group SSy1 corresponds to the above second gradation selecting MOS transistor group. The switch S2 corresponds to the above first switch.

In this case, the gradation selecting MOS transistor group SSy0 is turned on in response to the first control signal, and selects a gradation voltage Va (first gradation voltage) applied to a node Ty0. The gradation selecting MOS transistor group SSy1 is turned on in response to the first control signal, and selects a gradation voltage Vb (second gradation voltage) applied to a node Ty1.

The switch S2 is turned on in response to the first control signal, and outputs the gradation voltage Va, which is the gradation voltage Vn1 applied to the node Ta, as the output gradation voltage Vx0'. The output gradation voltage Vx0' is applied to the output node Tout, and is supplied to the buffer amplifier 26.

When the output gradation voltage in response to the display data Dj is Vx1', the gradation voltage control portion 30 outputs the second control signal to the gradation selecting MOS transistor groups SSy0, SSy1, the switch S1 and the switch S2. Herein, as shown in FIGS. 8 and 9, a reference symbol x1 is expressed by 1, 9, 17, 25, 33, 41, 49 or 57. A reference symbol y0 is expressed by 0, 2, 4, 6, 8, 10, 12 and 14 so that a reference symbol y0 corresponds to the reference symbol x1, and the reference symbol y1 is expressed by 1, 3, 5, 7, 9, 11, 13 and 15 so that the reference symbol y1 corresponds to the reference symbol x1 (y1=y0+1). The same explanation as the case that the output gradation voltage is Vx0' is omitted, and the switch S2 corresponds to the above I-th (I=1) switch.

In this case, the gradation selecting MOS transistor group SSy0 is turned on in response to the second control signal, and selects the gradation voltage Va (first gradation voltage) applied to the node Ty0. The gradation selecting MOS transistor group SSy1 is turned on in response to the second control signal, and selects the gradation voltage Vb (second gradation voltage) applied to the node Ty1.

The switch S1 is turned on in response to the second control signal. At this time, the gradation selecting MOS transistor groups SSy0, SSy1 and the half gradation voltage generating portion 32 (half gradation voltage generation MOS transistor groups SSa and SSb) voltage-divide the gradation voltage between the gradation voltage Va applied to the node Ty0 and the gradation voltage Vb applied to the node Ty1 into four equal parts $\{(Va+Vb)/4\}$ in response to the second control signal, and generates three half gradation voltages Vn1, Vn2 and Vn3. The three half gradation voltages Vn1, Vn2 and Vn3 correspond to the above first half gradation voltage, the second half gradation voltage and the third half gradation voltage respectively, and are respectively applied to the nodes Ta, Tb and Tc. As shown in FIG. 10, the half gradation voltages Vn1, Vn2 and Vn3 are determined by the ON resistances of the gradation selecting MOS transistor groups SSy0, SSy1 and the half gradation voltage generation MOS transistor groups SSa and SSb.

The switch S2 is turned on in response to the second control signal, and outputs the half gradation voltage Vn1 applied to the node Ta as an output gradation voltage Vx1'. The output gradation voltage Vx1' is applied to the output node Tout, and is supplied to the buffer amplifier 26.

When the output gradation voltage in response to the display data Dj is Vx2', the gradation voltage control portion 30 outputs the second control signal to the gradation selecting MOS transistor groups SSy0, SSy1, the switches S1 and S3. Herein, as shown in FIGS. 8 and 9, a reference symbol x2 is expressed by 2, 10, 18, 26, 34, 42, 50 or 58. The reference symbol y0 is expressed by 0, 2, 4, 6, 8, 10, 12 and 14 so that the reference symbol y0 corresponds to the reference symbol X2, and the reference symbol y1 is expressed by 1, 3, 5, 7, 9, 11, 13 and 15 so that y1 corresponds to X2 (y1=y0+1). The same explanation as the case that the output gradation voltage is Vx1' is omitted, and the switch S3 corresponds to the above I-th (I=2) switch.

In this case, the switch S3 is turned on in response to the second control signal, and outputs the half gradation voltage Vn2 applied to the node Tb as the output gradation voltage Vx2'. The output gradation voltage Vx2' is applied to the output node Tout, and is supplied to the buffer amplifier 26.

When the output gradation voltage in response to the display data Dj is Vx3', the gradation voltage control portion 30 outputs the second control signal to the gradation selecting MOS transistor groups SSy0, SSy1, the switches S1 and S4. Herein, as shown in FIGS. 8 and 9, a reference symbol x3 is expressed by 3, 11, 19, 27, 35, 43, 51 or 59. The reference symbol y0 is expressed by 0, 2, 4, 6, 8, 10, 12 and 14, and the reference symbol y1 is expressed by 1, 3, 5, 7, 9, 11, 13 and 15 so that the reference symbol y1 corresponds to the reference symbol x3 (y1=y0+1). The same explanation as the case that the output gradation voltage is Vx1' is omitted, the switch S4 corresponds to the I-th (I=3) above switch.

In this case, the switch S4 is turned on in response to the second control signal, and outputs the half gradation voltage Vn3 applied to the node Tc as the output gradation voltage Vx3'. The output gradation voltage Vx3' is applied to the output node Tout, and is supplied to the buffer amplifier 26.

When the output gradation voltage in response to the display data Dj is Vx4', the gradation voltage control portion 30 outputs the first control signal to the gradation selecting MOS transistor groups SSy1, SSy0 and the switch S4. Herein, as shown in FIGS. 8 and 9, a reference symbol x4 is expressed by 4, 12, 20, 28, 36, 44, 52 or 60. The reference symbol y1 is expressed by 1, 3, 5, 7, 9, 11, 13 and 15 so that the reference symbol y1 corresponds to the reference symbol x4, and the reference symbol y0 expressed by 2, 4, 6, 8, 10, 12, 14 and 16 (y0=y1+1) so that the reference symbol y0 corresponds to the reference symbol X4. The gradation selecting MOS transistor group SSy1 corresponds to the above first gradation selecting MOS transistor group, and the gradation selecting MOS transistor group SSy0 corresponds to the above second gradation selecting MOS transistor group. The switch S4 corresponds to the above first switch.

In this case, the gradation selecting MOS transistor group SSy1 is turned on in response to the first control signal, and selects the gradation voltage Vb (first gradation voltage) applied to the node Ty1. The gradation selecting MOS transistor group SSy0 is turned on in response to the first control signal, and selects the gradation voltage Va (second gradation voltage) applied to the node Ty0.

The switch S4 is turned on in response to the first control signal, and outputs the gradation voltage Vb, which is the gradation voltage Vn3 applied to the node Tc, as the output gradation voltage Vx4'. The output gradation voltage Vx4' is applied to the output node Tout, and is supplied to the buffer amplifier 26.

When the output gradation voltage in response to the display data Dj is Vx5', the gradation voltage control portion 30 outputs the second control signal to the gradation selecting MOS transistor groups SSy1, SSy0, the switch S1, and the switch S4. Here, as shown in FIGS. 8 and 9, a reference symbol x5 is expressed by 5, 13, 21, 29, 37, 45, 53 or 61. The reference symbol y1 is expressed by 1, 3, 5, 7, 9, 11, 13 and 15 so that the reference symbol y1 corresponds to the reference symbol X5, and the reference symbol y0 is expressed by 2, 4, 6, 8, 10, 12, 14 and 16 (y0=y1+1) so that the reference symbol y0 corresponds to the reference symbol x5. The same explanation as the case that the output gradation voltage is Vx4' is omitted, and the switch S4 corresponds to the above I-th (I=1) switch.

In this case, the gradation selecting MOS transistor group SSy1 is turned on in response to the second control signal, and selects the gradation voltage Vb (first gradation voltage) applied to the node Ty1. The gradation selecting MOS transistor group SSy0 is turned on in response to the second control signal, and selects the gradation voltage Va (second gradation voltage) applied to the node Ty0.

The switch S1 is turned on in response to the second control signal. At this time, the gradation selecting MOS transistor groups SSy1, SSy0 and the half gradation voltage generating portion 32 (half gradation voltage generation MOS transistor groups SSa, SSb) voltage-divide the gradation voltage between the gradation voltage Vb applied to the node Ty1 and the gradation voltage Va applied to the node Ty0 into four equal parts $\{(Va+Vb)/4\}$ in response to the second control signal, and generates the three half gradation voltages Vn1, Vn2 and Vn3. The three half gradation voltages Vn1, Vn2 and Vn3 correspond to the above third half gradation voltage, the second half gradation voltage and the first half gradation voltage respectively, and are respectively applied to the nodes Ta, Tb and Tc. As shown in FIG. 10, the half gradation voltages Vn1, Vn2 and Vn3 are determined by the ON resistances of the gradation selecting MOS transistor groups SSy0, SSy1 and the half gradation voltage generation MOS transistor groups SSa and SSb.

The switch S4 is turned on in response to the second control signal, and outputs the half gradation voltage Vn3 applied to the node Tc as the output gradation voltage Vx5'. The output gradation voltage Vx5' is applied to the output node Tout, and is supplied to the buffer amplifier 26.

When the output gradation voltage in response to the display data Dj is Vx6', the gradation voltage control portion 30 outputs the second control signal to the gradation selecting MOS transistor groups SSy1, SSy0, the switch S1 and the switch S3. Herein, as shown in FIGS. 8 and 9, a reference symbol x6 is expressed by 6, 14, 22, 30, 38, 46, 54 or 62. The reference symbol y1 is expressed by 1, 3, 5, 7, 9, 11, 13 and 15 so that the reference symbol y1 corresponds to the reference symbol x6, and the reference symbol y0 is expressed by 2, 4, 6, 8, 10, 12, 14 and 16 so that the reference symbol y0 corresponds to the reference symbol X6 (y0=y1+1). The same explanation as the case that the output gradation voltage is Vx5' is omitted, and the switch S3 corresponds to the above switch I-th (I=2).

In this case, the switch S3 is turned on in response to the second control signal, and outputs the half gradation voltage Vn2 applied to the Node Tb as the output gradation voltage Vx6'. The output gradation voltage Vx6' is applied to the output node Tout, and is supplied to the buffer amplifier 26.

When the output gradation voltage in response to the display data Dj is Vx7', the gradation voltage control portion 30 outputs the second control signal to the gradation selecting MOS transistor groups SSy1, SSy0, the switch S1, and the switch S2. Herein, as shown in FIGS. 8 and 9, a reference symbol x7 is expressed by 7, 15, 23, 31, 39, 47, 55 or 63. The reference symbol y1 is expressed by 1, 3, 5, 7, 9, 11, 13 and 15 so that the reference symbol y1 corresponds to the reference symbol X7, and the reference symbol y0 is expressed by 2, 4, 6, 8, 10, 12, 14 and 16 so that the reference symbol y0 corresponds to the reference symbol x7 (y0=y1+1). The same explanation as the case that the output gradation voltage is Vx5' is omitted, and the switch S2 corresponds to the above I-th (I=3) switch.

In this case, the switch S3 is turned on in response to the second control signal, and outputs the half gradation voltage Vn1 applied to the node Ta as the output gradation voltage Vx7'. The output gradation voltage Vx7' is applied to the output node Tout, and is supplied to the buffer amplifier 26.

As described above, in the source driver circuit 3-j, the half gradation voltage generating portion 32 (M-pieces half gradation voltage generation MOS transistor groups) is arranged in parallel with the series resistance voltage dividing circuit 27 (resistive elements R0 to R15). The resistance values of resistive elements R0 to R15 of the series resistance voltage dividing circuit 27 are usually several tens of ohms to several hundreds ohms. Therefore, the resistance value of the half gradation voltage generating portion 32 of several mega ohms or more is required so that the voltage levels of the output gradation voltages V00' to V63' are not fluctuated.

In the gradation voltage selecting circuit 25 of the liquid crystal display device of the present invention, the gradation selecting MOS transistor group SSy0, the half gradation voltage generation MOS transistor groups SSa, SSb, and the gradation selecting MOS transistor group SSy1 voltage-divide the gradation voltage between the first gradation voltage and the second gradation voltage into four equal parts in response to the second control signal, and generate the three half gradation voltages. At this time, a high resistance of several mega ohms or more can be obtained by the ON resistances of the gradation selecting MOS transistor group SSy0, the half gradation voltage generation MOS transistor groups SSa, SSb, and the gradation selecting MOS transistor group SSy1. Therefore, the voltage levels of the output gradation voltages V00' to V63' are not fluctuated.

As described above, according to the liquid crystal display device of the present invention, the high resistance of several mega ohms or more can be obtained by the above ON resistance without using the resistive element having the resistance value of several mega ohms or more in the gradation voltage selecting circuit 25. Therefore, the circuit scale of the gradation voltage selecting circuit 25, the circuit scales of the source driver circuits 3-1 to 3-n, and the circuit scale of the liquid crystal drive circuit can be reduced from the conventional one.

Since the circuit scale can be reduced according to the liquid crystal display device of the present invention, the chip size of the chip on which the liquid crystal drive circuit is mounted can be reduced, and the liquid crystal display device can be satisfied in the needs of thin type.

Although the above MOS transistor is the P type MOS transistor in the first embodiment, the MOS transistor is not limited thereto.

The gradation selecting MOS transistor groups SS0 to SS16 of the gradation selecting portion 31, the half gradation voltage generation MOS transistor groups SSa (half gradation voltage generation MOS transistor group SSa', switch S1) of the half gradation voltage generating portion 32, and the N-pieces MOS transistors of SSb may be N type MOS transistors. So as to simplify the explanation, the switches S2, S3 and S4 (MOS transistors) of the switching portion 33 are the N type MOS transistors. In this case, the gradation voltage control portion 30 outputs the first control signal or the second control signal at a high level in response to the display data.

A power supply voltage VDD is supplied to the half gradation voltage generation MOS transistor group Ssa' as the control signal for always turning on the N type MOS transistor. The power supply voltage VDD is supplied to the gates of the N-pieces MOS transistors of the half gradation voltage generation MOS transistor group SSb.

Second Embodiment

Figure 11:
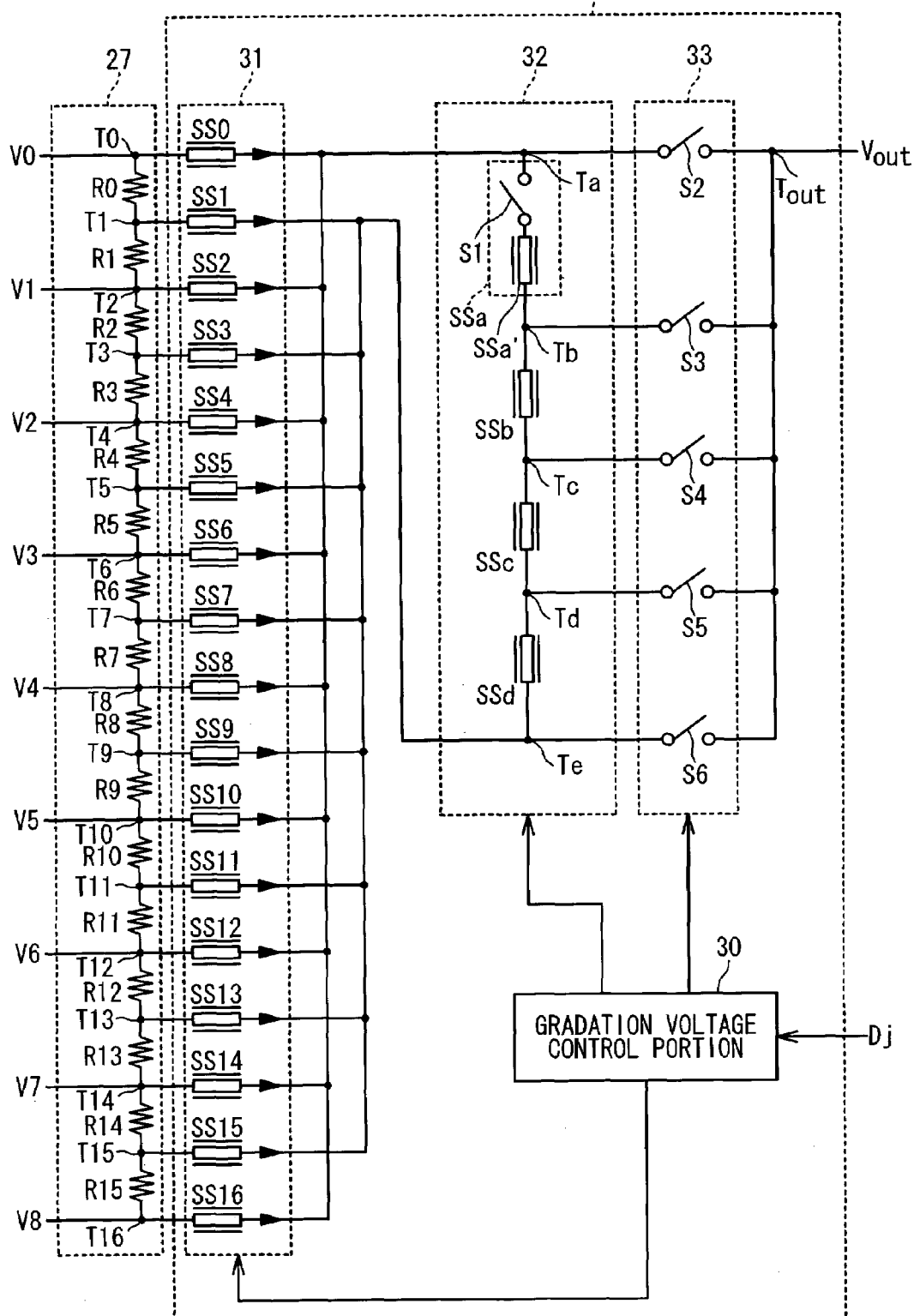
FIG. 11 is a block diagram showing the configurations of the series resistance voltage dividing circuit and gradation voltage selecting circuit of the liquid crystal display device according to the second embodiment of the present invention.

The second embodiment of a liquid crystal display device according to the present invention will be described below with reference to the attached drawings. FIG. 11 is a block diagram showing the configurations of the series resistance voltage dividing circuit and gradation voltage selecting circuit of the liquid crystal display device according to the second embodiment of the present invention.

The description repeated with the first embodiment is omitted in the liquid crystal display device according to the second embodiment of the present invention.

When M is set to 2 in the first embodiment, 64 gradations (Z=64) are realized as a large number of gradations. However, for example, even when M is set to 4 as the liquid crystal display device according to the second embodiment of the present invention, the large number of gradations can be realized, as shown in FIG. 11. That is, the large number of gradations can be realized by increasing the M-pieces half gradation voltage generation MOS transistor groups of the half gradation voltage generating portion 32, and the switch of the switching portion 33 by the same number.

Similar to the first embodiment, the above ON resistances are generated in the gradation voltage selecting circuit 25 in the second embodiment by using the resistance (polyresistor) due to the poly wiring of the upper layer of the MOS transistor constituting the gradation selecting MOS transistor groups SSy0, SSy1 and the M-pieces half gradation voltage generation MOS transistor groups. Therefore, even when M is changed to 4 from 2, the surface area of the MOS transistor itself is not increased. For example, the polyresistor is about 300 kΩ as in the first embodiment.

Third Embodiment

The third embodiment of a liquid crystal display device according to the present invention will be described below with reference to the attached drawings.

The description repeated with the first embodiment and the second embodiment is omitted in the liquid crystal display device according to the third embodiment of the present invention.

In the gradation voltage selecting circuit 25 in the first embodiment and the second embodiment, as described above, the (M+1)-pieces half gradation voltage is determined by the ON resistances of the gradation selecting MOS transistor groups SSy0, SSy1 and the M-pieces half gradation voltage generation MOS transistor groups. However, errors of the ON resistances of the above MOS transistor groups may occur on various conditions. Examples of the conditions include the case that the value of the ON resistance of the above MOS transistor group is lower than a desired resistance value due to the difference in manufacture processes, the case that the N type MOS transistor having a low value of the ON resistance constitutes the above MOS transistor group, and the case that the ON resistance of the above MOS transistor group is fluctuated by the operating voltage. In these cases, it is necessary to reduce the error of the ON resistance in the gradation voltage selecting circuit 25.

As the liquid crystal display device according to the third embodiment of the present invention, the gradation voltage selecting circuit 25 is further includes a resistance portion for reducing the error of the ON resistance. The resistance portion contains a first resistive element, a second resistive element and M-pieces resistive elements.

Figure 12:
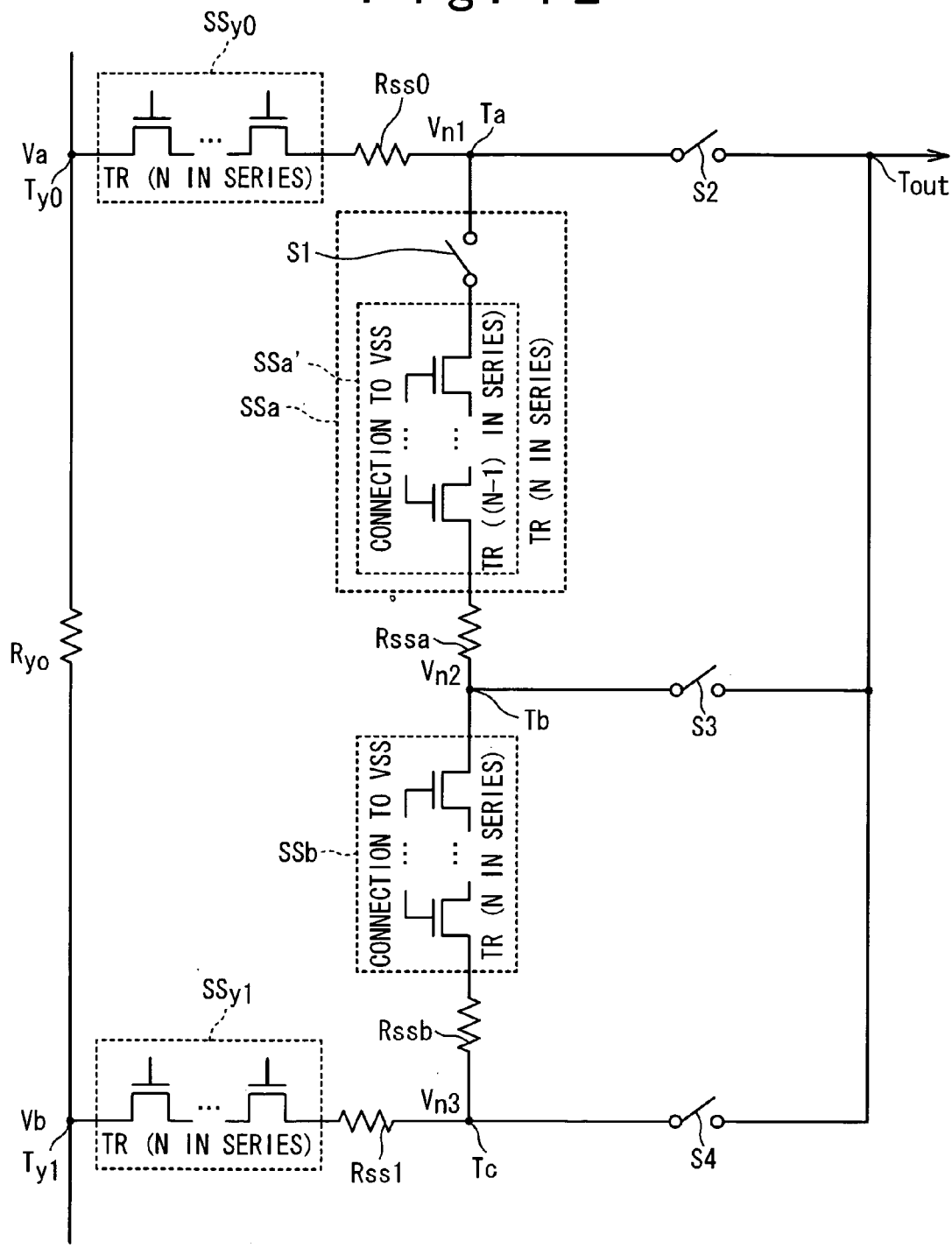
FIG. 12 is a circuit diagram showing a part of the configurations of the series resistance voltage dividing circuit and the gradation voltage selecting circuit of the source driver circuit of the liquid crystal display device according to the third embodiment of the present invention.

FIG. 12 is a circuit diagram showing a part of the configurations of the series resistance voltage dividing circuit and the gradation voltage selecting circuit of the source driver circuit of the liquid crystal display device according to the third embodiment of the present invention.

Herein, the above M is set to 2, and the configuration of the gradation voltage selecting circuit 25 will be specifically explained with reference to FIG. 12.

In this case, the above first resistive element is expressed as a resistive element Rss0, and the above second resistive element is expressed as a resistive element Rss1. The above M-pieces resistive elements are expressed as resistive elements Rssa and Rssb. As in the first embodiment, the M-pieces half gradation voltage generation MOS transistor groups of the half gradation voltage generating portion 32 are expressed as the half gradation voltage generation MOS transistor groups SSa, SSb, and the (M+1)-pieces switches of the switching portion 33 are expressed as the switches S2, S3 and S4 which are the MOS transistors.

The resistive element Rss0 is connected to the gradation selecting MOS transistor group SSy0 in series. For example, the node Ty0 is connected to the first-stage MOS transistor of the gradation selecting MOS transistor group SSy0. The one end of the resistive element Rss0 is connected to the final-stage MOS transistor of the gradation selecting MOS transistor group SSy0, and the node Ta is connected to the other end of the resistive element Rss0.

The resistive element Rss1 is connected to the gradation selecting MOS transistor group SSy1 in series. For example, the node Ty1 is connected to the first-stage MOS transistor of the gradation selecting MOS transistor group SSy1, the one end of the resistive element Rss1 is connected to the final-stage MOS transistor of the gradation selecting MOS transistor group SSy1, and the node Tc is connected to the other end of the resistive element Rss1.

The M-pieces resistive elements are alternately and respectively connected to the M-pieces half gradation voltage generation MOS transistor groups. For example, the node Ta is connected to the first-stage MOS transistor of the half gradation voltage generation MOS transistor group SSa. The one end of the resistive element Rssa is connected to the final-stage MOS transistor of the half gradation voltage generation MOS transistor group SSa, and the node Tb is connected to the other end of the resistive element Rssa. The node Tb is connected to the first-stage MOS transistor of the half gradation voltage generation MOS transistor group SSb. The one end of the resistive element Rssb is connected to the final-stage MOS transistor of the half gradation voltage generation MOS transistor group SSb, and the node Tc is connected to the other end of the resistive element Rssb.

The node Ta is connected to the one end of the switch S2, and the output node Tout is connected to the other end of the switch S2. The node Tb is connected to the one end of the switch S3, and the output node Tout is connected to the other end of the switch S3. The node Tc is connected to the one end of the switch S4, and the output node Tout is connected to the other end of the switch S4.

The operation of the gradation voltage selecting circuit 25 in the third embodiment will be explained with reference to FIGS. 8 and 12.

For example, when the output gradation voltage in response to the display data Dj is Vx1', the gradation voltage control portion 30 outputs the second control signal to the gradation selecting MOS transistor groups SSy0, SSy1, the switch S1, and the switch S2. Herein, as shown in FIGS. 8 and 12, the reference symbol x1 is expressed by 1, 9, 17, 25, 33, 41, 49 or 57, and the reference symbol y0 is expressed by 0, 2, 4, 6, 8, 10, 12 and 14 so that the reference symbol y0 corresponds to the reference symbol x1. The reference symbol y1 is expressed by 1, 3, 5, 7, 9, 11, 13 and 15 so that the reference symbol y1 corresponds to the reference symbol x1.

In this case, the gradation selecting MOS transistor group SSy0 is turned on in response to the second control signal, and selects the gradation voltage Va (first gradation voltage) applied to the node Ty0. The gradation selecting MOS transistor group SSy1 is turned on in response to the second control signal, and selects the gradation voltage Vb (second gradation voltage) applied to the node Ty1.

The switch S1 is turned on in response to the second control signal. At this time, the gradation selecting MOS transistor groups SSy0, Ssy1 and the half gradation voltage generating portion 32 (half gradation voltage generation MOS transistor groups SSa, SSb) voltage-divide the gradation voltage between the gradation voltage Va applied to the node Ty0, and the gradation voltage Vb applied to the node Ty1 into four equal parts {(Va+Vb)/4} in response to the second control signal, and generates the three half gradation voltages Vn1, Vn2 and Vn3. The three half gradation voltages Vn1, Vn2 and Vn3 are respectively applied to the nodes Ta, Tb and Tc. The half gradation voltages Vn1, Vn2 and Vn3 are determined by the ON resistances of the gradation selecting MOS transistor groups SSy0, SSy1 and the half gradation voltage generation MOS transistor groups SSa, SSb, and the resistances of the resistive elements Rss0, Rss1, Rssa and Rssb.

The switch S2 is turned on in response to the second control signal, and outputs the half gradation voltage Vn1 applied to the node Ta as the output gradation voltage Vx1'. The output gradation voltage Vx1' is applied to the output node Tout, and is supplied to the buffer amplifier 26.

When the output gradation voltage in response to the display data Dj is Vx5', the gradation voltage control portion 30 outputs the second control signal to the gradation selecting MOS transistor groups SSy1, SSy0, the switch S1, and the switch S4. Herein, as shown in FIGS. 8 and 12, the reference symbol x5 is expressed by 5, 13, 21, 29, 37, 45, 53 or 61. The reference symbol y1 is expressed by 1, 3, 5, 7, 9, 11, 13, and 15 so that the reference symbol y1 corresponds to the reference symbol x5, and the reference symbol y0 is expressed by 2, 4, 6, 8, 10, 12, 14 and 16 so that the reference symbol y0 corresponds to the reference symbol x5.

In this case, the gradation selecting MOS transistor group SSy1 is turned on in response to the second control signal, and selects the gradation voltage Vb (first gradation voltage) applied to the node Ty1. The gradation selecting MOS transistor group SSy0 is turned on in response to the second control signal, and selects the gradation voltage Va (second gradation voltage) applied to the node Ty0.

The switch S1 is turned on in response to the second control signal. At this time, the gradation selecting MOS transistor groups SSy1, SSy0, and the half gradation voltage generating portion 32 (half gradation voltage generation MOS transistor groups SSa, SSb) voltage-divide the gradation voltage between the gradation voltage Vb applied to the node Ty1, and the gradation voltage Va applied to the node Ty0 into four equal parts {(Va+Vb)/4} in response to the second control signal, and generates the three half gradation voltages Vn1, Vn2 and Vn3. The three half gradation voltages Vn1, Vn2, Vn3 are respectively applied to the nodes Ta, Tb and Tc. The half gradation voltages Vn1, Vn2 and Vn3 are determined by the ON resistances of the gradation selecting MOS transistor groups SSy0, SSy1 and half gradation voltage generation MOS transistor groups SSa, SSb, and the resistances of the resistive elements Rss0, Rss1, Rssa and Rssb.

The switch S4 is turned on in response to the second control signal, and outputs the half gradation voltage Vn3 applied to the node Tc as the output gradation voltage Vx5'. The output gradation voltage Vx5' is applied to the output node Tout, and is supplied to the buffer amplifier 26.

Thus, the resistance portions (a resistive element Rss0, Rss1, Rssa, and Rssb) for reducing the error of the ON resistance are provided in the gradation voltage selecting circuit 25 in the liquid crystal display device of the present invention. Thereby, the half gradation voltages Vn1, Vn2 and Vn3 are determined by the ON resistances of the gradation selecting MOS transistor groups SSy0, SSy1 and half gradation voltage generation MOS transistor groups SSa, SSb, and the resistance of the resistance portion (resistive elements Rss0, Rss1, Rssa and Rssb). Therefore, the half gradation voltages Vn1, Vn2 and Vn3 are correctly generated in the gradation voltage selecting circuit 25 of the liquid crystal display device of the present invention.

Fourth Embodiment

The fourth embodiment of a liquid crystal display device according to the present invention will be described below with reference to the attached drawings.

The description repeated with the third embodiment is omitted in the liquid crystal display device according to the fourth embodiment of the present invention.

When the gradation voltage selecting circuit 25 includes the above resistance portion, a time constant due to the resistance of the resistance portion becomes larger, and thereby the operation of the circuit may become slow. When an offset cancellation function is given to a drive amplifier (buffer amplifier 26) connected to the gradation voltage selecting circuit 25 through the output node Tout, the magnitude of the time constant may cause a problem. In this case, so as to improve the delay of the circuit operation due to the magnitude of the time constant of the resistance portion, it is necessary to realize a high-speed operation.

As the liquid crystal display device according to the fourth embodiment of the present invention, the gradation voltage selecting circuit 25 further includes a pre-charging switching portion. The pre-charging switching portion contains a first pre-charging switch and a second pre-charging switch.

Figure 13:
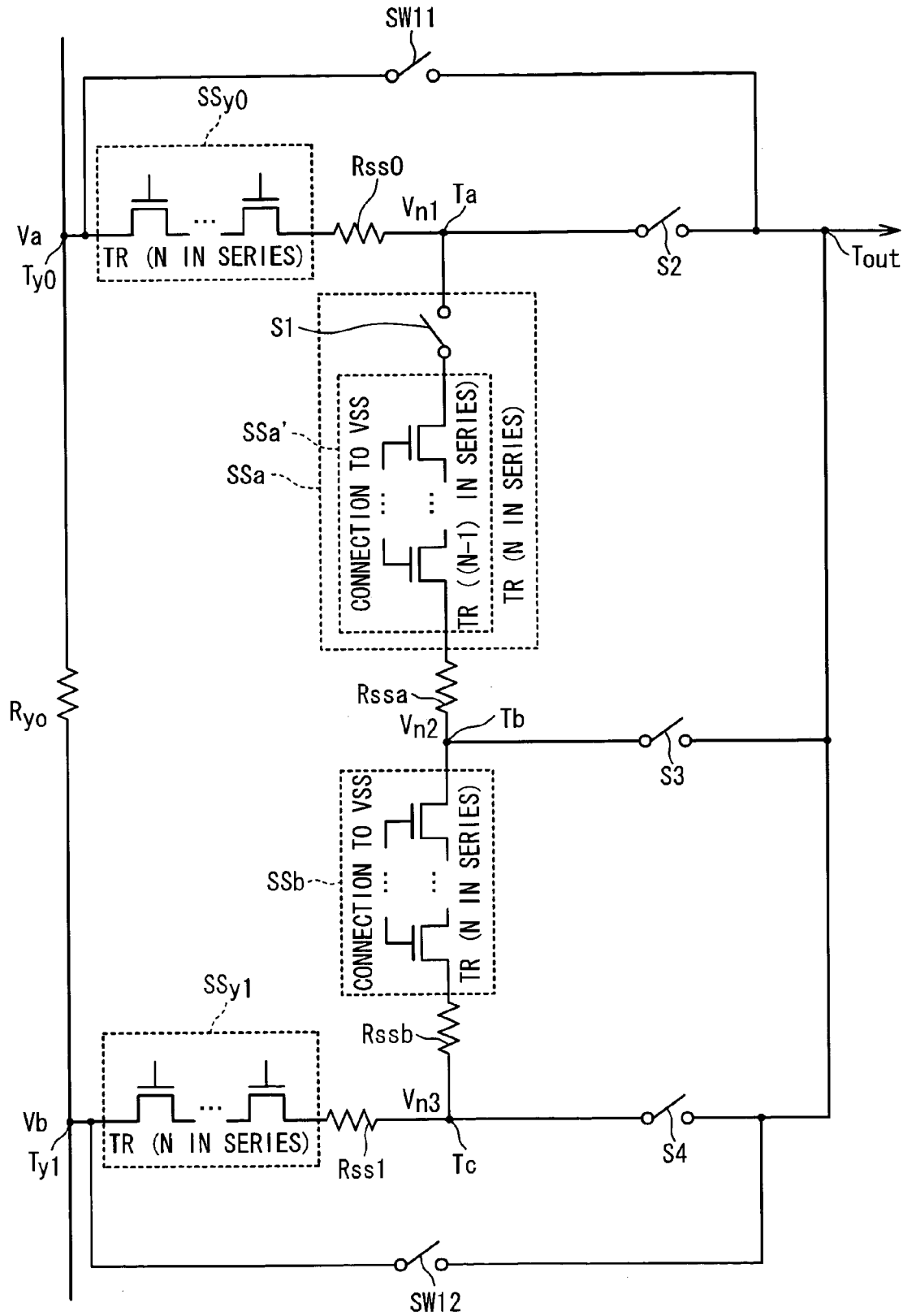
FIG. 13 is a circuit diagram showing a part of the configurations of the series resistance voltage dividing circuit and the gradation voltage selecting circuit of the source driver circuit of the liquid crystal display device according to the fourth embodiment of the present invention.

FIG. 13 is a circuit diagram showing a part of the configurations of the series resistance voltage dividing circuit and the gradation voltage selecting circuit of the source driver circuit of the liquid crystal display device according to the fourth embodiment of the present invention.

Herein, the above-mentioned M is set to 2, and the configuration of the gradation voltage selecting circuit 25 will be specifically explained with reference to FIG. 13.

In this case, the first pre-charging switch is expressed as a pre-charging switch SW11, and the second pre-charging switch is expressed as a pre-charging switch SW12. As in the third embodiment, the first above resistive element is expressed as the resistive element Rss0, and the above second resistive element is expressed as the resistive element Rss1. The above M-pieces resistive elements are expressed as the resistive elements Rssa and Rssb. As in the third embodiment, the M-pieces half gradation voltage generation MOS transistor groups of the half gradation voltage generating portion 32 are expressed as the half gradation voltage generation MOS transistor groups SSa, SSb, and the (M+1)-pieces switches of the switching portion 33 are expressed as the switches S2, S3 and S4 which are the MOS transistors.

The pre-charging switch SW11 is connected in parallel to the gradation selecting MOS transistor group SSy0, the resistive element Rss0 and the switch S2 connected in series. For example, the node Ty0 is connected to the first-stage MOS transistor of the gradation selecting MOS transistor group SSy0, and the one end of the resistive element Rss0 is connected to the final-stage MOS transistor of the gradation selecting MOS transistor group SSy0. The node Ta is connected to the other end of the resistive element Rss0. The node Ta is connected to the one end of the switch S2, and the output node Tout is connected to the other end of the switch S2. The first-stage MOS transistor of the gradation selecting MOS transistor group SSy0 is connected to the one end of the pre-charging switch SW11, and the other end of the switch S2 is connected to the other end of the pre-charging switch SW11.

The pre-charging switch SW12 is connected in parallel to the gradation selecting MOS transistor group SSy1, the resistive element Rss1 and the switch S4 connected in series. For example, the node Ty1 is connected to the first-stage MOS transistor of the gradation selecting MOS transistor group SSy1, and the one end of the resistive element Rss1 is connected to the final-stage MOS transistor of the gradation selecting MOS transistor group SSy1. The node Tc is connected to the other end of the resistive element Rss1. The node Tc is connected to the one end of the switch S4, and the output node Tout is connected to the other end of the switch S4. The first-stage of MOS transistor of the gradation selecting MOS transistor group SSy1 is connected to the one end of the pre-charging switch SW12, and the other end of the switch S4 is connected to the other end of the pre-charging switch SW12.

For example, the gradation voltage control portion 30 decides whether the output gradation voltage in response to the display data Dj is close to the gradation voltage Va applied to the node Tyo, or is close to the gradation voltage Vb applied to the node Ty1 by using the bit decision of the display data Dj. The gradation voltage control portion 30 selects one pre-charging switch of the pre-charging switch SW11 and pre-charging switch SW12 based on the result of the decision, and supplies a pulse signal as the fourth control signal to the selected pre-charging switch (not shown). In the embodiment, the gradation voltage control portion 30 outputs the fourth control signal to the pre-charging switch SW11 when outputting the second control signal to the switches S2 and S3 in response to the display data Dj, and outputs the pulse signal to the pre-charging switch SW12 when outputting the second control signal to the switch S4.

The operation of the gradation voltage selecting circuit 25 in the fourth embodiment will be explained with reference to FIGS. 8 and 13.

For example, when the output gradation voltage in response to the display data Dj is Vx0', the gradation voltage control portion 30 outputs the first control signal to the gradation selecting MOS transistor groups SSy0, SSy1 and the switch S2, and outputs the pulse signal to the pre-charging switch SW11. Herein, as shown in FIGS. 8 and 13, the reference symbol x0 is expressed by 0, 8, 16, 24, 32, 40, 48 or 56. The reference symbol y0 is expressed by 0, 2, 4, 6, 8, 10, 12 and 14 so that the reference symbol y0 corresponds to the reference symbol X0, and the reference symbol y1 is expressed by 1, 3, 5, 7, 9, 11, 13 and 15 so that the reference symbol y1 corresponds to the reference symbol X0.

In this case, the gradation selecting MOS transistor group SSy0 is turned on in response to the first control signal, and selects the gradation voltage Va (first gradation voltage) applied to the node Ty0. The gradation selecting MOS transistor group SSy1 is turned on in response to the first control signal, and selects the gradation voltage Vb (second gradation voltage) applied to the node Ty1.

The pre-charging switch SW11 is turned on in response to the rise of the pulse signal. At this time, the voltage supplied to the output node Tout is pre-charged to the gradation voltage Va.

The switch S2 is turned on in response to the second control signal.

The pre-charging switch SW11 is turned off in response to the falling of the pulse signal. At this time, since the switch S2 is turned on in response to the first control signal, the gradation voltage Va which is the gradation voltage Vn1 applied to the node Ta is outputted. After the gradation voltage Va is pre-charged, the gradation voltage Va from the switch S2 is supplied to the output node Tout as output gradation voltage Vx0' (desired gradation voltage), and the output gradation voltage Vx0' is supplied to the buffer amplifier 26.

When the output gradation voltage in response to the display data Dj is Vx1', the gradation voltage control portion 30 outputs the second control signal to the gradation selecting MOS transistor groups SSy0, SSy1, the switch S1 and the switch S2, and outputs the pulse signal to the pre-charging switch SW11. Herein, as shown in FIGS. 8 and 13, the reference symbol x1 is expressed by 1, 9, 17, 25, 33, 41, 49 or 57, and the reference symbol y0 is expressed by 0, 2, 4, 6, 8, 10, 12 and 14 so that the reference symbol y0 corresponds to the reference symbol x1. The reference symbol y1 is expressed by 1, 3, 5, 7, 9, 11, 13, and 15 so that the reference symbol y1 corresponds to the reference symbol x1.

In this case, the gradation selecting MOS transistor group SSy0 is turned on in response to the second control signal, and selects the gradation voltage Va (first gradation voltage) applied to the node Ty0. The gradation selecting MOS transistor group SSy1 is turned on in response to the second control signal, and selects the gradation voltage Vb (second gradation voltage) applied to the node Ty1.

FIG. 14 is a graph showing the pre-charge operation of the gradation voltage selecting circuit of the source driver circuit of the liquid crystal display device according to the fourth embodiment of the present invention.

The pre-charging switch SW11 is turned on in response to the rise of the pulse signal. At this time, the voltage supplied to the output node Tout is pre-charged to the gradation voltage Va as shown in FIG. 14.

The switch S1 is turned on in response to the second control signal. At this time, the gradation selecting MOS transistor groups SSy0, SSy1 and the half gradation voltage generating portion 32 (half gradation voltage generation MOS transistor groups SSa and SSb) voltage-divide the gradation voltage between the gradation voltage Va applied to the node Ty0, and the gradation voltage Vb applied to the node Ty1 into four equal parts {(Va+Vb)/4} in response to the second control signal, and generates the three half gradation voltages Vn1, Vn2 and Vn3. The three half gradation voltages Vn1, Vn2 and Vn3 are respectively applied to the nodes Ta, Tb and Tc. The half gradation voltages Vn1, Vn2 and Vn3 are determined by the ON resistances of the gradation selecting MOS transistor groups SSy0, SSy1 and half gradation voltage generation MOS transistor groups SSa and SSb, and the resistances of the resistive elements Rss0, Rss1, Rssa and Rssb.

The switch S2 is turned on in response to the second control signal.

The pre-charging switch SW11 is turned off in response to the falling of the pulse signal. Since the switch S2 is turned on in response to the second control signal at this time, the half gradation voltage Vn1 applied to the node Ta is outputted. After the gradation voltage Va is pre-charged, the half gradation voltage Vn1 from the switch S2 is supplied to the output node Tout as the output gradation voltage Vx1' (desired gradation voltage), and the output gradation voltage Vx1' is supplied to the buffer amplifier 26 (see FIG. 14).

When the output gradation voltage in response to the display data Dj is Vx4', the gradation voltage control portion 30 outputs the first control signal to the gradation selecting MOS transistor groups SSy1, SSy0, and the switch S4, and outputs the pulse signal to the pre-charging switch SW12. Herein, as shown in FIGS. 8 and 13, the reference symbol x4 is expressed by 4, 12, 20, 28, 36, 44, 52 or 60. The reference symbol y1 is expressed by 1, 3, 5, 7, 9, 11, 13 and 15 so that the reference symbol y1 corresponds to the reference symbol x4, and the reference symbol y0 is expressed by 2, 4, 6, 8, 10, 12, 14 and 16 so that the reference symbol y0 corresponds to the reference symbol x4.

In this case, the gradation selecting MOS transistor group SSy1 is turned on in response to the first control signal, and selects the gradation voltage Vb (first gradation voltage) applied to the node Ty1. The gradation selecting MOS transistor group SSy0 is turned on in response to the first control signal, and selects the gradation voltage Va (second gradation voltage) applied to the node Ty0.

The pre-charging switch SW12 is turned on in response to the rise of the pulse signal. The voltage supplied to the output node Tout at this time is pre-charged to the gradation voltage Vb.

The switch S4 is turned on in response to the first control signal.

The pre-charging switch SW12 is turned off in response to the falling of the pulse signal. Since the switch S4 is turned on in response to the second control signal at this time, the gradation voltage Vb which is the gradation voltage Vn3 applied to the node Tc is outputted. After the gradation voltage Vb is pre-charged, the gradation voltage Vb from the switch S4 is supplied to the output node Tout as output gradation voltage VX4' (desired gradation voltage), and the output gradation voltage Vx4' is supplied to the buffer amplifier 26.

When the output gradation voltage in response to the display data Dj is Vx5', the gradation voltage control portion 30 outputs the second control signal to the gradation selecting MOS transistor groups SSy1, SSy0, the switch S1, and the switch S4, and outputs the pulse signal to the pre-charging switch SW12. Herein, as shown in FIGS. 8 and 13, the reference symbol x5 is expressed by 5, 13, 21, 29, 37, 45, 53 or 61. The reference symbol y1 is expressed by 1, 3, 5, 7, 9, 11, 13 and 15 so that the reference symbol y1 corresponds to the reference symbol x5, and the reference symbol y0 is expressed by 2, 4, 6, 8, 10, 12, 14 and 16 so that the reference symbol y0 corresponds to the reference symbol x5.

In this case, the gradation selecting MOS transistor group SSy1 is turned on in response to the second control signal, and selects the gradation voltage Vb (first gradation voltage) applied to the node Ty1. The gradation selecting MOS transistor group SSy0 is turned on in response to the second control signal, and selects the gradation voltage Va (second gradation voltage) applied to the node Ty0.

The pre-charging switch SW12 is turned on in response to the rise of the pulse signal. At this time, the voltage supplied to the output node Tout is pre-charged to the gradation voltage Vb.

The switch S1 is turned on in response to the second control signal. At this time, the gradation selecting MOS transistor groups SSy1, SSy0 and the half gradation voltage generating portion 32 (half gradation voltage generation MOS transistor groups SSa and SSb) voltage-divide the gradation voltage between the gradation voltage Vb applied to the node Ty1, and the gradation voltage Va applied to the node Ty0 into four equal parts {(Va+Vb)/4} in response to the second control signal, and generates the three half gradation voltages Vn1, Vn2 and Vn3. The three half gradation voltages Vn1, Vn2 and Vn3 are respectively applied to the nodes Ta, Tb and Tc. The half gradation voltages Vn1, Vn2 and Vn3 are determined by the ON resistances of the gradation selecting MOS transistor groups SSy0, SSy1 and the half gradation voltage generation MOS transistor groups SSa, SSb, and the resistances of the resistive elements Rss0, Rss1, Rssa and Rssb.

The switch S4 is turned on in response to the second control signal.

The pre-charging switch SW12 is turned off in response to the falling of the pulse signal. Since the switch S4 is turned on in response to the second control signal at this time, the half gradation voltage Vn3 applied to the node Tc is outputted. After the gradation voltage Vb is pre-charged, the half gradation voltage Vn3 is supplied to the output node Tout from the switch S4 as the output gradation voltage Vx5' (desired gradation voltage), and the output gradation voltage Vx5' is supplied to the buffer amplifier 26.

Thus, in the liquid crystal display device of the present invention, so as to improve the delay of the circuit operation due to the magnitude of the time constant of the resistance portion (resistive elements Rss0, Rss1, Rssa and Rssb), the high-speed operation of the gradation voltage selecting circuit 25 can be realized by providing the pre-charging switching portion (pre-charging switches SW11 and SW12) in the gradation voltage selecting circuit 25.

It is apparent that the present invention is not limited to the above embodiment, that may be modified and changed without departing form the scope and spirit of the invention.

What is claimed is:

1. A gradation voltage selecting circuit comprising:
a plurality of gradation selecting MOS transistor groups, each of which corresponds to one of plurality of gradation voltages;
M-pieces (M is a positive integer) half gradation voltage generating MOS transistor groups which are connected to each other in series;
a switching portion; and
a control portion which supplies a first control signal in response to a first display data, and supplies a second control signal in response to a second display data,
wherein a first gradation selecting MOS transistor group as one of said plurality of gradation selecting MOS transistor groups selects a first gradation voltage corresponding to said first gradation selecting MOS transistor group in response to one of said first and second control signals,
a second gradation selecting MOS transistor group as one of said plurality of gradation selecting MOS transistor groups selects a second gradation voltage corresponding to said second gradation selecting MOS transistor group in response to one of said first and second control signals,
said first and second gradation selecting MOS transistor groups and said M-pieces half gradation voltage generating MOS transistor groups voltage-divide a gradation voltage between said first gradation voltage and said second gradation voltage into (M+2) equal parts in response to said second control signal, and generate (M+1)-pieces half gradation voltages,
said switching portion outputs said first gradation voltage selected by said first gradation selecting MOS transistor group into a display portion in response to said first control signal, and selects and outputs one of said (M+1)-pieces half gradation voltage into the display portion in response to said second control signal, and
said (M+1)-pieces half gradation voltages are determined by ON resistance of said first and second gradation selecting MOS transistor groups and said half gradation voltage generating MOS transistor groups,
wherein each of said M-pieces half gradation voltage generating MOS transistor groups includes N-pieces (N is a integer equal to or more than 2) MOS transistors connected to each other in series,
said M-pieces half gradation voltage generating MOS transistor groups includes a control half gradation voltage generating MOS transistor group, of which J-pieces (J is a positive integer equal to or less than N) MOS transistors receives said second control signal,
(N-J)-pieces MOS transistors of said control half gradation voltage generating MOS transistor group receives a third control signal for always turning on, and
N-pieces MOS transistors of said M-pieces half gradation voltage generating MOS transistor groups other than said control half gradation voltage generating MOS transistor group receives said third control signal.

2. The gradation voltage selecting circuit according to claim 1, wherein said switching portion includes (M+1)-pieces switches,
said control portion supplies said first control signal to said first and second gradation selecting MOS transistor groups and a first switch as one of said (M+1)-pieces switches in response to said first display data,
said first switch outputs said first gradation voltage selected by said first gradation selecting MOS transistor group to the display portion through a output node in response to said first control signal, said control portion supplies said second control signal to said first and second gradation selecting MOS transistor groups, said J-pieces MOS transistors of said control half gradation voltage generating MOS transistor group and a I-th (I is a positive integer equal to or less than (M+1)) switch of said (M+1)-pieces switches in response to said second display data, and said I-th switch outputs a I-th half gradation voltage of said (M+1)-pieces half gradation voltages to the display portion through said output node in response to said second control signal.

3. The gradation voltage selecting circuit according to claim 2, further comprising:

a resistance portion which reduces an error of said ON resistance, wherein said resistance portion includes:

a first resistance which is connected to said first gradation selecting MOS transistor group in series, a second resistance which is connected to said second gradation selecting MOS transistor group in series, and M-pieces resistance which are alternately connected to said M-pieces half gradation voltage selecting MOS transistor groups, said (M+1)-pieces half gradation voltages is determined by said ON resistance and a resistance of said resistance portion.

4. The gradation voltage selecting circuit according to claim 3, further comprising a pre-charging switching portion, wherein said control portion supplies a fourth control signal, which is a pulse signal, to said pre-charging switching portion when outputting one of said first and second control signals, said pre-charging switching portion pre-charges a voltage supplied to said output node to said first gradation voltage in response to said fourth control signal, said first switch supplies said first gradation voltage to said output node in response to said first control signal, and said output node receives said first gradation voltage from said first switch after being pre-charged to said first gradation voltage, and said I-th switch supplies said I-th half gradation voltage to said output node in response to said second control signal, and said output node receives said I-th half gradation voltage from said I-th switch after being pre-charged to said first gradation voltage.

5. A driver circuit, comprising:

a gradation voltage selecting circuit to which a display portion is connected, and a first display data and a second display data is supplied, and a series resistance dividing circuit which voltage-divides a reference voltage into a plurality of gradation voltages, and supplies said plurality of gradation voltages to said gradation voltage selecting circuit, wherein said gradation voltage selecting circuit includes:

a plurality of gradation selecting MOS transistor groups, each of which corresponds to one of said plurality of gradation voltages;

M-pieces (M is a positive integer) half gradation voltage generating MOS transistor groups which are connected to each other in series;

a switching portion; and a control portion which supplies a first control signal in response to a first display data, and supplies a second control signal in response to a second display data, wherein a first gradation selecting MOS transistor group as one of said plurality of gradation selecting MOS transistor groups selects a first gradation voltage corresponding to said first gradation selecting MOS transistor group in response to one of said first and second control signals, a second gradation selecting MOS transistor group as one of said plurality of gradation selecting MOS transistor groups selects a second gradation voltage corresponding to said second gradation selecting MOS transistor group in response to one of said first and second control signals, said first and second gradation selecting MOS transistor groups and said M-pieces half gradation voltage generating MOS transistor groups voltage-divide a gradation voltage between said first gradation voltage and said second gradation voltage into (M+2) equal parts in response to said second control signal, and generate (M+1)-pieces half gradation voltages, said switching portion outputs said first gradation voltage selected by said first gradation selecting MOS transistor group into said display portion in response to said first control signal, and selects and outputs one of said (M+1)-pieces half gradation voltage into the display portion in response to said second control signal, and said (M+1)-pieces half gradation voltages are determined by ON resistance of said first and second gradation selecting MOS transistor groups and said half gradation voltage generating MOS transistor groups, wherein each of said M-pieces half gradation voltage generating MOS transistor groups includes N-pieces (N is a integer equal to or more than 2) MOS transistors connected to each other in series, said M-pieces half gradation voltage generating MOS transistor groups includes a control half gradation voltage generating MOS transistor group, of which J-pieces (J is a positive integer equal to or less than N) MOS transistors receives said second control signal, (N-J)-pieces MOS transistors of said control half gradation voltage generating MOS transistor group receives a third control signal for always turning on, and N-pieces MOS transistors of said M-pieces half gradation voltage generating MOS transistor groups other than said control half gradation voltage generating MO S transistor group receives said third control signal.

6. The driver circuit according to claim 5, wherein said switching portion includes (M+1)-pieces switches, said control portion supplies said first control signal to said first and second gradation selecting MOS transistor groups and a first switch as one of said (M+1)-pieces switches in response to said first display data, said first switch outputs said first gradation voltage selected by said first gradation selecting MOS transistor group to the display portion through a output node in response to said first control signal, said control portion supplies said second control signal to said first and second gradation selecting MOS transistor groups, said J-pieces MOS transistors of said control half gradation voltage generating MOS transistor group and a I-th (I is a positive integer equal to or less than (M+1)) switch of said (M+1)-pieces switches in response to said second display data, and said I-th switch outputs a I-th half gradation voltage of said (M+1)-pieces half gradation voltages to the display portion through said output node in response to said second control signal.

7. The driver circuit according to claim 6, further comprising:
- a resistance portion which reduces an error of said ON resistance,
- wherein said resistance portion includes:
- a first resistance which is connected to said first gradation selecting MOS transistor group in series,
- a second resistance which is connected to said second gradation selecting MOS transistor group in series, and
- M-pieces resistance which are alternately connected to said M-pieces half gradation voltage selecting MOS transistor groups,
- said (M+1)-pieces half gradation voltages is determined by said ON resistance and a resistance of said resistance portion.

8. The driver circuit according to claim 7, further comprising
- a pre-charging switching portion,
- wherein said control portion supplies a fourth control signal, which is a pulse signal, to said pre-charging switching portion when outputting one of said first and second control signals,
- said pre-charging switching portion pre-charges a voltage supplied to said output node to said first gradation voltage in response to said fourth control signal,
- said first switch supplies said first gradation voltage to said output node in response to said first control signal, and said output node receives said first gradation voltage from said first switch after being pre-charged to said first gradation voltage, and
- said I-th switch supplies said I-th half gradation voltage to said output node in response to said second control signal, and said output node receives said I-th half gradation voltage from said I-th switch after being pre-charged to said first gradation voltage.

9. A liquid crystal driver comprising:
- a plurality of driver circuits which are connected to a display portion; and
- a power supply circuit which generates a reference voltage,
- wherein each of said driver circuit includes:
- a gradation voltage selecting circuit to which said display portion is connected, and a first display data and a second display data is supplied, and
- a series resistance dividing circuit which voltage-divides said reference voltage into a plurality of gradation voltages, and supplies said plurality of gradation voltages to said gradation voltage selecting circuit,
- wherein said gradation voltage selecting circuit includes:
- a plurality of gradation selecting MOS transistor groups, each of which corresponds to one of said plurality of gradation voltages;
- M-pieces (M is a positive integer) half gradation voltage generating MOS transistor groups which are connected to each other in series;
- a switching portion; and
- a control portion which supplies a first control signal in response to a first display data, and supplies a second control signal in response to a second display data,
- wherein a first gradation selecting MOS transistor group as one of said plurality of gradation selecting MOS transistor groups selects a first gradation voltage corresponding to said first gradation selecting MOS transistor group in response to one of said first and second control signals,
- a second gradation selecting MOS transistor group as one of said plurality of gradation selecting MOS transistor groups selects a second gradation voltage corresponding to said second gradation selecting MOS transistor group in response to one of said first and second control signals,
- said first and second gradation selecting MOS transistor groups and said M-pieces half gradation voltage generating MOS transistor groups voltage-divide a gradation voltage between said first gradation voltage and said second gradation voltage into (M+2) equal parts in response to said second control signal, and generate (M+1)-pieces half gradation voltages,
- said switching portion outputs said first gradation voltage selected by said first gradation selecting MOS transistor group into said display portion in response to said first control signal, and selects and outputs one of said (M+1)-pieces half gradation voltage into the display portion in response to said second control signal, and
- said (M+1)-pieces half gradation voltages are determined by ON resistance of said first and second gradation selecting MOS transistor groups and said half gradation voltage generating MOS transistor groups,
- wherein each of said M-pieces half gradation voltage generating MOS transistor groups includes N-pieces (N is a integer equal to or more than 2) MOS transistors connected to each other in series,
- said M-pieces half gradation voltage generating MOS transistor groups includes a control half gradation voltage generating MOS transistor group, of which J-pieces (J is a positive integer equal to or less than N) MOS transistors receives said second control signal,
- (N-J)-pieces MOS transistors of said control half gradation voltage generating MOS transistor group receives a third control signal for always turning on, and
- N-pieces MOS transistors of said M-pieces half gradation voltage generating MOS transistor groups other than said control half gradation voltage generating MOS transistor group receives said third control signal.

10. The liquid crystal driver circuit according to claim 9, wherein said switching portion includes (M+1)-pieces switches,
- said control portion supplies said first control signal to said first and second gradation selecting MOS transistor groups and a first switch as one of said (M+1)-pieces switches in response to said first display data,
- said first switch outputs said first gradation voltage selected by said first gradation selecting MOS transistor group to the display portion through a output node in response to said first control signal,
- said control portion supplies said second control signal to said first and second gradation selecting MOS transistor groups, said J-pieces MOS transistors of said control half gradation voltage generating MOS transistor group and a I-th (I is a positive integer equal to or less than (M+1)) switch of said (M+1)-pieces switches in response to said second display data, and
- said I-th switch outputs a I-th half gradation voltage of said (M+1)-pieces half gradation voltages to the display portion through said output node in response to said second control signal.

11. The liquid crystal driver circuit according to claim 10, further comprising:
- a resistance portion which reduces an error of said ON resistance,
- wherein said resistance portion includes:
- a first resistance which is connected to said first gradation selecting MOS transistor group in series,
- a second resistance which is connected to said second gradation selecting MOS transistor group in series, and M-pieces resistance which are alternately connected to said M-pieces half gradation voltage selecting MOS transistor groups, said (M+1)-pieces half gradation voltages is determined by said ON resistance and a resistance of said resistance portion.

12. The liquid crystal driver circuit according to claim 11, further comprising a pre-charging switching portion, wherein said control portion supplies a fourth control signal, which is a pulse signal, to said pre-charging switching portion when outputting one of said first and second control signals, said pre-charging switching portion pre-charges a voltage supplied to said output node to said first gradation voltage in response to said fourth control signal, said first switch supplies said first gradation voltage to said output node in response to said first control signal, and said output node receives said first gradation voltage from said first switch after being pre-charged to said first gradation voltage, and said I-th switch supplies said I-th half gradation voltage to said output node in response to said second control signal, and said output node receives said I-th half gradation voltage from said I-th switch after being pre-charged to said first gradation voltage.

13. A liquid crystal display comprising:

a display portion; and a liquid crystal driver circuit which is connected to said display portion, wherein said liquid crystal driver circuit includes:

a plurality of driver circuits which are connected to said display portion; and a power supply circuit which generates a reference voltage, wherein each of said driver circuit includes:

a gradation voltage selecting circuit to which said display portion is connected, and a first display data and a second display data is supplied, and a series resistance dividing circuit which voltage-divides said reference voltage into a plurality of gradation voltages, and supplies said plurality of gradation voltages to said gradation voltage selecting circuit, wherein said gradation voltage selecting circuit includes:

a plurality of gradation selecting MOS transistor groups, each of which corresponds to one of said plurality of gradation voltages;

M-pieces (M is a positive integer) half gradation voltage generating MOS transistor groups which are connected to each other in series;

a switching portion; and a control portion which supplies a first control signal in response to a first display data, and supplies a second control signal in response to a second display data, wherein a first gradation selecting MOS transistor group as one of said plurality of gradation selecting MOS transistor groups selects a first gradation voltage corresponding to said first gradation selecting MOS transistor group in response to one of said first and second control signals, a second gradation selecting MOS transistor group as one of said plurality of gradation selecting MOS transistor groups selects a second gradation voltage corresponding to said second gradation selecting MOS transistor group in response to one of said first and second control signals, said first and second gradation selecting MOS transistor groups and said M-pieces half gradation voltage generating MOS transistor groups voltage-divide a gradation voltage between said first gradation voltage and said second gradation voltage into (M+2) eciual parts in response to said second control signal, and generate (M+1)-pieces half gradation voltages, said switching portion outputs said first gradation voltage selected by said first gradation selecting MOS transistor group into said display portion in response to said first control signal, and selects and outputs one of said (M+1)-pieces half gradation voltage into the display portion in response to said second control signal, and said (M+1)-pieces half gradation voltages are determined by ON resistance of said first and second gradation selecting MOS transistor groups and said half gradation voltage generating MOS transistor groups, wherein each of said M-pieces half gradation voltage generating MOS transistor groups includes N-pieces (N is a integer equal to or more than 2) MOS transistors connected to each other in series, said M-pieces half gradation voltage generating MOS transistor groups includes a control half gradation voltage generating MOS transistor group, of which J-pieces (J is a positive integer equal to or less than N) MOS transistors receives said second control signal, (N-J)-pieces MOS transistors of said control half gradation voltage generating MOS transistor group receives a third control signal for always turning on, and N-pieces MOS transistors of said M-pieces half gradation voltage generating MOS transistor groups other than said control half gradation voltage generating MOS transistor group receives said third control signal.

14. The liquid crystal display according to claim 13, wherein said switching portion includes (M+1)-pieces switches, said control portion supplies said first control signal to said first and second gradation selecting MOS transistor groups and a first switch as one of said (M+1)-pieces switches in response to said first display data, said first switch outputs said first gradation voltage selected by said first gradation selecting MOS transistor group to the display portion through a output node in response to said first control signal, said control portion supplies said second control signal to said first and second gradation selecting MOS transistor groups, said J-pieces MOS transistors of said control half gradation voltage generating MOS transistor group and a I-th (I is a positive integer equal to or less than (M+1)) switch of said (M+1)-pieces switches in response to said second display data, and said I-th switch outputs a I-th half gradation voltage of said (M+1)-pieces half gradation voltages to the display portion through said output node in response to said second control signal.

15. The liquid crystal display according to claim 14, further comprising:

a resistance portion which reduces an error of said ON resistance, wherein said resistance portion includes:

a first resistance which is connected to said first gradation selecting MOS transistor group in series, a second resistance which is connected to said second gradation selecting MOS transistor group in series, and M-pieces resistance which are alternately connected to said M-pieces half gradation voltage selecting MOS transistor groups, said (M+1)-pieces half gradation voltages is determined by said ON resistance and a resistance of said resistance portion.

16. The liquid crystal display according to claim 15, further comprising
a pre-charging switching portion,
wherein said control portion supplies a fourth control signal, which is a pulse signal, to said pre-charging switching portion when outputting one of said first and second control signals,
said pre-charging switching portion pre-charges a voltage supplied to said output node to said first gradation voltage in response to said fourth control signal,
said first switch supplies said first gradation voltage to said output node in response to said first control signal, and said output node receives said first gradation voltage from said first switch after being pre-charged to said first gradation voltage, and
said I-th switch supplies said I-th half gradation voltage to said output node in response to said second control signal, and said output node receives said I-th half gradation voltage from said I-th switch after being pre-charged to said first gradation voltage.

17. A method for selecting gradation voltage by using a gradation voltage selecting circuit, wherein said gradation voltage selecting circuit includes:
a plurality of gradation selecting MOS transistor groups, each of which corresponds to one of plurality of gradation voltages;
M-pieces (M is a positive integer) half gradation voltage generating MOS transistor groups which are connected to each other in series;
a switching portion; and
a control portion which supplies a first control signal in response to a first display data, and supplies a second control signal in response to a second display data,
the method comprising:
(a) selecting a first gradation voltage corresponding to said first gradation selecting MOS transistor group in response to said second control signal by a first gradation selecting MOS transistor group as one of said plurality of gradation selecting MOS transistor groups,
(b) selecting a second gradation voltage corresponding to said second gradation selecting MOS transistor group in response to said second control signal by a second gradation selecting MOS transistor group as one of said plurality of gradation selecting MOS transistor
(c) voltage-dividing a gradation voltage between said first gradation voltage and said second gradation voltage into (M+2) equal parts in response to said second control signal, and generating (M+1)-pieces half gradation voltages by said first and second gradation selecting MOS transistor groups and said M-pieces half gradation voltage generating MOS transistor groups, and
(d) selecting and outputting one of said (M+1)-pieces half gradation voltage into the display portion in response to said second control signal by said switching portion,
wherein said (M+1)-pieces half gradation voltages are determined by ON resistance of said first and second gradation selecting MOS transistor groups and said half gradation voltage generating MOS transistor group,
wherein each of said M-pieces half gradation voltage generating MOS transistor groups includes N-pieces (N is a integer equal to or more than 2) MOS transistors connected to each other in series, said step (c) includes:
(c1) receiving said second control signal by J-pieces (J is a positive integer equal to or less than N) MOS transistors, wherein said M-pieces half gradation voltage generating MOS transistor groups includes a control half gradation voltage generating MOS transistor group which has J-pieces MOS transistors, (c2) receiving a third control signal for always turning on by (N-J)-pieces MOS transistors of said control half gradation voltage generating MOS transistor group, and
(c3) receiving said third control signal by N-pieces MOS transistors of said M-pieces half gradation voltage generating MOS transistor groups other than said control half gradation voltage generating MOS transistor group.

18. The method for selecting gradation voltage according to claim 17, wherein said switching portion includes (M+1)-pieces switches, said step (a) includes:
(a1) supplying said second control signal to said first gradation selecting MOS transistor groups in response to said second display data by said control portion, said step (b) includes:
(b1) supplying said second control signal to said second gradation selecting MOS transistor groups in response to said second display data by said control portion, and said step (c) includes:
(c4) supplying said second control signal to said J-pieces MOS transistors of said control half gradation voltage generating MOS transistor group in response to said second display data by said control portion, said step (d) includes:
(d1) supplying said second control signal to a I-th (I is a positive integer equal to or less than (M+1)) switch of said (M+1)-pieces switches in response to said second display data by said control portion, and
(d2) outputting a I-th half gradation voltage of said (M+1)-pieces half gradation voltages to the display portion through said output node in response to said second control signal by said I-th switch.

19. The method for selecting gradation voltage according to claim 18, wherein said gradation voltage selecting circuit further includes:
a resistance portion which reduces an error of said ON resistance,
wherein said resistance portion includes:
a first resistance which is connected to said first gradation selecting MOS transistor group in series,
a second resistance which is connected to said second gradation selecting MOS transistor group in series, and
M-pieces resistance which are alternately connected to said M-pieces half gradation voltage selecting MOS transistor groups,
said (M+1)-pieces half gradation voltages is determined by said ON resistance and a resistance of said resistance portion.

20. The method for selecting gradation voltage according to claim 19, wherein said gradation voltage selecting circuit further includes a pre-charging switching portion, the method further comprising:
(f) supplying a fourth control signal, which is a pulse signal, to said pre-charging switching portion when outputting said second control signals by said control portion,
(g) pre-charging a voltage supplied to said output node to said first gradation voltage in response to said fourth control signal by said pre-charging switching portion,
said step (d2) includes:
(d21) supplying said I-th half gradation voltage to said output node in response to said second control signal by said I-th switch,
said output node receives said I-th half gradation voltage from said I-th switch after being pre-charged to said first gradation voltage.

* * * * *